(12) United States Patent
Strange

(10) Patent No.: US 7,492,228 B2
(45) Date of Patent: Feb. 17, 2009

(54) VOLTAGE CONTROLLED OSCILLATOR HAVING IMPROVED PHASE NOISE

(75) Inventor: Jonathan Richard Strange, Surrey (GB)

(73) Assignee: MediaTek Inc. (TW)

( * ) Notice: Subject to any disclaimer, the term of this patent is extended or adjusted under 35 U.S.C. 154(b) by 59 days.

(21) Appl. No.: 11/362,935

(22) Filed: Feb. 27, 2006

(65) Prior Publication Data
US 2006/0145771 A1    Jul. 6, 2006

Related U.S. Application Data

(63) Continuation-in-part of application No. 10/679,997, filed on Oct. 7, 2003, now Pat. No. 7,038,552.

(51) Int. Cl.
*H03L 7/00* (2006.01)

(52) U.S. Cl. .................... 331/16; 331/34; 331/179; 331/175; 327/156

(58) Field of Classification Search .................. 331/185, 331/16, 34, 179, 17, 175; 327/156
See application file for complete search history.

(56) References Cited

U.S. PATENT DOCUMENTS

| | | | | |
|---|---|---|---|---|
| 5,783,972 | A * | 7/1998 | Nishikawa | 331/17 |
| 7,062,229 | B2 * | 6/2006 | Dunworth et al. | 455/76 |
| 2002/0075080 | A1 * | 6/2002 | Nelson et al. | 331/11 |
| 2003/0001684 | A1 | 1/2003 | Magoon et al. | |
| 2003/0011437 | A1 * | 1/2003 | Ozawa | 331/2 |
| 2003/0025566 | A1 | 2/2003 | Rogers | |

* cited by examiner

*Primary Examiner*—Arnold Kinkead
(74) *Attorney, Agent, or Firm*—Fish & Richardson P.C.

(57) ABSTRACT

An apparatus for compensating for variations in loop gain of a phase locked loop as a function of frequency, comprising a correction calculator for introducing a loop gain correction as a function of target frequency of a oscillator controlled by the phase locked loop.

33 Claims, 14 Drawing Sheets

VOLTAGE CONTROLLED OSCILLATOR HAVING IMPROVED PHASE NOISE

The present invention relates to a voltage controlled oscillator having reduced phase noise, and to an apparatus for and method of controlling such an oscillator.

BACKGROUND OF THE INVENTION

Mobile telephones, in common with many radio systems up-convert a signal to be transmitted from a base band to the transmission frequency. A relatively wide spread of transmission frequencies are supported by the mobile telephone and consequently the transmission oscillator and local oscillator provided within such a telephone need to be tuneable over a relatively wide range of frequencies.

In general, if it is desired to tune a voltage controlled oscillator, VCO, over a relatively wide frequency range, then a relatively large constant of proportionality $K_{VCO}$ between the oscillator output frequency and the oscillator input control voltage is required. The use of a large $K_{VCO}$ enables the tuning range to be traversed quickly. This means that the local oscillator can be rapidly moved between frequencies and locked to the new frequency. There is, however, a penalty to be paid for this ease of tuning. Any noise appearing on the control voltage has potential to appear in the oscillator's output spectrum. This noise can result in fluctuations of the phase of the oscillator's output from the phase of an ideal sinusoid having the same frequency as the nominal frequency of the oscillator. These deviations amount to phase noise at the output of the oscillator.

The GSM standard for mobile telephones places limits on the phase noise that can be permitted in the transmission envelope of a mobile telephone. The limits are mandatory in that devices falling outside of these limits will not be accredited for use. The production of phase noise in the local oscillator or the transmission oscillator of the mobile telephone could easily cause the output signal's power density away from the nominal transmit frequency to exceed the permitted transmission power envelope. As a result, the voltage controlled oscillators of a mobile phone have typically been expensive discreet devices.

One way to address the phase noise problem is to have the voltage controlled oscillator with a much lower $K_{VCO}$. Thus any noise on the oscillator control voltage has a proportionally reduced effect on the oscillator output frequency. However this, whilst reducing phase noise, makes it more difficult to tune the oscillator over a wide operating range.

Within a mobile telephone the VCO is included within a phase locked loop (PLL). Phase locked loops are well known to a person skilled in the art. A reference signal and a signal derived from the output of the VCO are compared by a phase detector. The output of the phase detector is then transformed (typically by low pass filtering) into a control signal for the VCO.

For some oscillator topologies variations in oscillator amplitude give rise to variations in oscillator frequency and also affect $K_{VCO}$ and hence the loop gain of the PLL. This can make the design and control of a fast response frequency agile low phase noise VCO and associated circuitry difficult.

However, for other reasons the designer may actually wish the oscillator amplitude to be set to different target values for different modes of operation of the telephone. Thus oscillator amplitude may be larger during a transmit period compared to a receive period as phase noise requirement in the transmit process are more stringent.

SUMMARY OF THE INVENTION

According to the first aspect of the present invention there is provided a variable frequency oscillator comprising: a variable frequency oscillator core; an oscillator controller; and an output voltage stabilisation device for maintaining an amplitude of an oscillator output within a predetermined range, wherein the variable frequency oscillator core is controllable to operate in one of a plurality of frequency bands and has a frequency control input responsive to the oscillator controller, and where in order to set a new operating frequency the oscillator controller performs a frequency search through the bands to identify an appropriate band and wherein amplitude stabilisation is performed during band selection.

It is thus possible to provide improved stability in both the amplitude and frequency domains of the oscillator. This is important since amplitude and frequency control are not completely independent of one another and hence adjusting one of these parameters of oscillator performance has an effect on the other parameter.

Preferably the variable frequency oscillator is a voltage controlled oscillator.

Preferably the task of tuning the oscillator towards a target frequency is performed in an iterative manner. Thus the oscillator frequency converges on the target frequency. Such frequency control can be performed over a plurality of tuning steps. Preferably amplitude stabilisation is performed in association with at least one of the tuning steps. If the tuning is performed using a successive approximation approach to locating the correct frequency then the amplitude stabilisation may be performed in respect of all of the approximation steps, or only some of the approximation steps, for example the most significant bits/steps.

In an embodiment where binary weighted tuning capacitors are switched in and out of an inductor-capacitor resonant circuit of the oscillator, the switching in of a capacitor causes the resonant frequency to drop. Similarly removal of a capacitor from the resonant circuit causes the resonant frequency to rise. Thus, following the instruction to select a predetermined frequency, all of the tuning capacitors are switched out of the resonant circuit except for the most significant capacitor, $C_1$. The output voltage stabilisation device then acts to control the oscillator circuit so as to set the output amplitude to within a predetermined range of acceptable values. The voltage stabilisation is assumed to have occurred within a preset time period. At the end of the time period allowed for voltage stabilisation the determination of oscillator frequency is made. Voltage stabilisation may advantageously be inhibited during this period. Advantageously amplitude stabilisation is only performed after selection of a new capacitance value in the oscillator.

As part of the determination of the oscillator frequency a test is made to determine whether the oscillator frequency is higher than or lower than the target frequency. If the oscillator frequency is higher than the target frequency then the most significant capacitor is kept in the oscillator circuit, otherwise it is removed therefrom.

Following the setting of the most significant capacitor the process progresses to setting of the next most significant capacitor $C_2$. Once again the capacitor under test $C_2$, is switched into the oscillator circuit. The amplitude stabilisation device is then operated so as to control the oscillator output voltage to lie within a predetermined range of acceptable values, or to attain (within limits) a target value. Once the preset time period allocated to the amplitude stabilisation process has expired a test is then performed to see how the oscillator frequency compares with the target frequency. If the frequency of the oscillator is higher than the target frequency then the capacitor $C_2$ is kept in the oscillator circuit, whereas if the oscillator frequency is lower than the target frequency the capacitor $C_2$ is removed.

The subsequent capacitors $C_3$ to $C_N$, where $C_N$ is the least significant bit, are then set in turn in accordance with the aforementioned procedure.

This "band switching" approach to control the oscillator enables the use of a reduced $K_{VCO}$ in the oscillator and this results in reduced phase noise.

Preferably the amplitude control is performed by controlling the bias current flowing from a current source/sink into or out of the oscillator circuit. Current flow control can be used to control the amplitude of the circuit since restricting the current flow limits the rate of current change across inductors in the oscillator and hence the voltage developed across the inductors.

Preferably the frequency determination is performed by counting the voltage cycles from the oscillator and comparing the number of cycles with the output of a reference oscillator.

Preferably the amplitude control is performed digitally. The use of a digital amplitude control system results in non-obvious benefits in phase noise performance compared to an analog feedback system. An analog system continually strives to adjust the oscillator amplitude towards a target value. This constant variation, and the devices used to achieve it, can give rise to additional phase noise.

By using a digital system, the individual voltage levels are effectively invariant during the duration of each digital setting. This results in less noise being propagated into the oscillator and hence less phase noise at the output of the oscillator.

The oscillator performance in terms of actual oscillator frequency for a given combination of capacitors switched into the resonant circuit or given response to a control voltage variation is not tightly specified. Neither is the oscillator amplitude. Provided that the oscillator's performance lies within a reasonable broad range of acceptable values the PLL and the output voltage stabilisation device operate to effectively calibrate the oscillator performance. This in turn allows the use of simpler biasing schemes for the oscillator. It also removes the need to provide temperature compensation and reduces the need to design in supply rejection. These attributes of the oscillator in turn allow the omission of circuit components, ie temperature compensation circuits, or the simplification of other associated circuits—ie power supply regulation. This in turn reduces the component count and hence the number of noise sources, thereby reducing the introduction of noise into the oscillator and its control circuits/devices. This gives a reduction in phase noise.

According to a second aspect of the present invention there is provided a method of controlling a voltage controlled oscillator having a tuneable output frequency and an adjustable output amplitude, wherein following a step of varying a tuning capacitor value, an amplitude control function is performed prior to making a determination of whether the oscillator is operating within an acceptable frequency range.

According to a third aspect of the present invention there is provided an amplitude control system for a voltage controlled oscillator, wherein the control system is responsive to a measurement of oscillator amplitude and compares this with a target amplitude to derive an amplitude error value, and wherein the error value is used to control a digital amplitude controller such that changes in an oscillator amplitude control signal are quantised.

It is thus possible to provide an amplitude stabilisation system which does not adversely affect the phase noise performance of the oscillator.

Preferably the oscillator comprises a pair of matched transistors in a cross coupled configuration and connected to a current source (which term may also include a current sink). This configuration means that the current flowing in the oscillator is well defined and can be used to provide amplitude control of the oscillator.

Preferably the voltage developed across an inductor in a resonant circuit of the oscillator is monitored to provide a measurement of oscillator amplitude. The measurement of amplitude may be performed by rectifying the output of the oscillator and low pass filtering it to derive the measurement of the amplitude.

According to a fourth aspect of the present invention there is provided a method of controlling the amplitude of a voltage controlled oscillator having an amplitude control input, the method comprising the steps of determining an error between the oscillator amplitude and a target amplitude, and on the basis of the error measurement making a discrete adjustment to the amplitude control input, the amplitude control input being constrained to be one of a plurality of discrete values.

Advantageously the amplitude control is performed by a linear search, ramping up from the lowest amplitude value towards the target amplitude value. This approach, although slower than a successive approximation search, has the advantage that the maximum permissible oscillator amplitude is never exceeded. This is important as it can prevent the premature failure of devices within the integrated circuit due to excessive voltages occurring across them.

According to a fifth aspect of the present invention there is provided an apparatus for performing frequency compensation of the constant of proportionality of a voltage controlled oscillator within a phase locked loop, comprising a constant of proportionality modifier for modifying the constant of proportionality used in a frequency control loop as a function of a target frequency of the voltage controlled oscillator.

Preferably the frequency control is comprised of a coarse frequency control section and a fine frequency control section. The coarse frequency control section can be arranged to switch tuning capacitors in and out of a resonant circuit during a frequency space search in order to set the oscillator to approximately the correct frequency.

Once the coarse frequency adjustment has been performed, a fine frequency adjustment can be performed using a varactor (or equivalent component) to tweak the effective capacitance of the resonant circuit. Preferably the varactor is formed using one or more MOSFETs, where the gates are connected to the oscillator output and the sources and drains are connected to a frequency control port. The capacitance of the varactor will vary over one cycle, but the average capacitance is a function of the control voltage. This function contributes to the voltage-frequency gain of the oscillator ($K_{VCO}$), which in turn contributes to the loop gain of the phase locked loop, which controls the varactor.

PLL loop gain affects bandwidth, lock time, phase noise and stability. This loop gain, and hence $K_{VCO}$, should be well controlled if good response times are to be obtained, whilst avoiding feedback instability. Where MOSFET varactors are used, $K_{VCO}$ is a strong function of the oscillator amplitude and is therefore affected by frequency band, temperature, batch variations and frequency. Frequent amplitude calibrations effectively remove the dependency of $K_{VCO}$ on frequency band, temperature and batch-to-batch variations. Consequently we are left with an effective $K_{VCO}$ that is simply a function of frequency. In fact the calibrated $K_{VCO}$ is proportional to frequency[3] or $\omega^3$.

In a synthesizer PLL an output frequency or output signal is phase locked to a reference signal. A phase detector or phase frequency detector generates a negative feedback control signal which is proportional to the difference between the reference frequency $F_{REF}$ and a feedback frequency where the feedback frequency $F_{FB}$ is equal to the output frequency divided by N, and N is the divide ratio of the feedback dividers. The oscillator output frequency $F_{RF}$ is equal to $N \times F_{FB}$ and this is approximately equal to $N \times F_{REF}$. In such a PLL the open loop again is proportional to $K_{VCO}$ divided by N and this is approximately equal to $$K_{VCO} \times \frac{F_{REF}}{F_{RF}}$$

i.e. the gain is proportional to $$\frac{F^3}{F}$$

which is therefore proportional to $F^2$ where F is the output frequency or carrier frequency.

According to a sixth aspect of the present invention there is provided a method of performing frequency compensation of the constant of proportionality of a voltage controlled oscillator, the method comprising forming a correction signal as a function of target frequency of the voltage controlled oscillator and applying the correction signal to a control input of the voltage controlled oscillator.

Preferably the correction signal varies, either smoothly or in a step wise fashion, as a function of frequency squared.

According to a seventh aspect of the present invention there is provided a voltage controlled oscillator for use in a telecommunications device, wherein amplitude and frequency control parameters of the voltage controlled oscillator are varied depending upon the mode of operation of the telecommunications device.

Thus in a GSM mode it may be desirable to run the local oscillator at increased amplitude during the transmit phase in order to maximise the signal to noise ratio within the transmitted signal, thereby reducing phase noise. However during receive a reduction in amplitude saves current and hence increases battery life. In a dual mode telephone, e.g. one supporting both GSM and a code division multiple access scheme then the oscillator amplitude may be reduced in CDMA transmission compared to that used for GSM transmission.

According to an eighth aspect of the present invention there is provided a controllable current source in combination with a voltage controlled oscillator, wherein the current source provides current to the oscillator for controlling the amplitude of oscillation thereof, and wherein the current source comprises a plurality of current mirrors arranged in parallel.

Preferably the current mirrors are weighted and digitally controllable to switch them on or off. Advantageously the current mirrors are substantially binary weighted.

The use of the weighted current mirrors means that each mirror need only have a relatively low gain (for example unity) between its pair of transistors. Thus, any noise introduced into the side of the mirror defining the current is passed to the other side of the mirror without significant gain. Furthermore the noise from each of the individual mirrors is not coherent so the noise powers add as the square root of the sum of the squared contributions of the noise powers, whereas the currents add as a simple sum.

In the context of an oscillator control system where amplitude and frequency control is performed frequently it becomes possible to use circuit topologies that are simplified. The use of parallel current mirrors where the control current is defined by the current flowing through a resistor makes for a low noise mirror. The current mirror may receive its reference voltage from a regulator, such as a low drop out voltage regulator LDO. In this configuration current and voltage accuracy are not critical and hence the LDO and current mirror can be designed for low noise, even if this is at the expense of a degradation in voltage regulation.

Thus, the decision to design a voltage regulator for low noise rather than for maximum regulation gives further noise improvements without comprising oscillator amplitude stability.

BRIEF DESCRIPTION OF THE DRAWINGS

The present invention will further be described, by way of example, with reference to the accompany drawings, in which:

FIG. 1 schematically illustrates an oscillator configuration which is suitable for use as a local oscillator and as a transmit oscillator in a mobile telephone. The oscillator comprises a first inductor 2 connected between a positive supply rail VCC and a drain terminal 4 of a first field effect transistor 6. A source 8 of the field effect transistor 6 is connected to the output of a current control device such as a current source 10. Similarly a second inductor 22 is connected between the supply rail VCC and a drain 24 of a second field effect transistor 26. A source 28 of the second field effect transistor 26 is also connected to the output of the current source 10. The field effect transistors 6 and 26 are cross coupled such that a gate 9 of the first field effect transistor 6 is connected to the drain 24 of the second field effect transistor 26, and a gate 29 of the second field effect transistor 26 is connected to the drain 24 of the first field effect transistor 6. Finally, a variable capacitance is provided between the drain of the first field effect transistor 6 and the drain 24 of the second field effect transistor 26. The capacitance is provided via a digitally controlled bank of capacitors 40 which gives coarse frequency control of the voltage control oscillator and via a varactor unit 42 which provides fine frequency control of the VCO output frequency.

Figure 1:
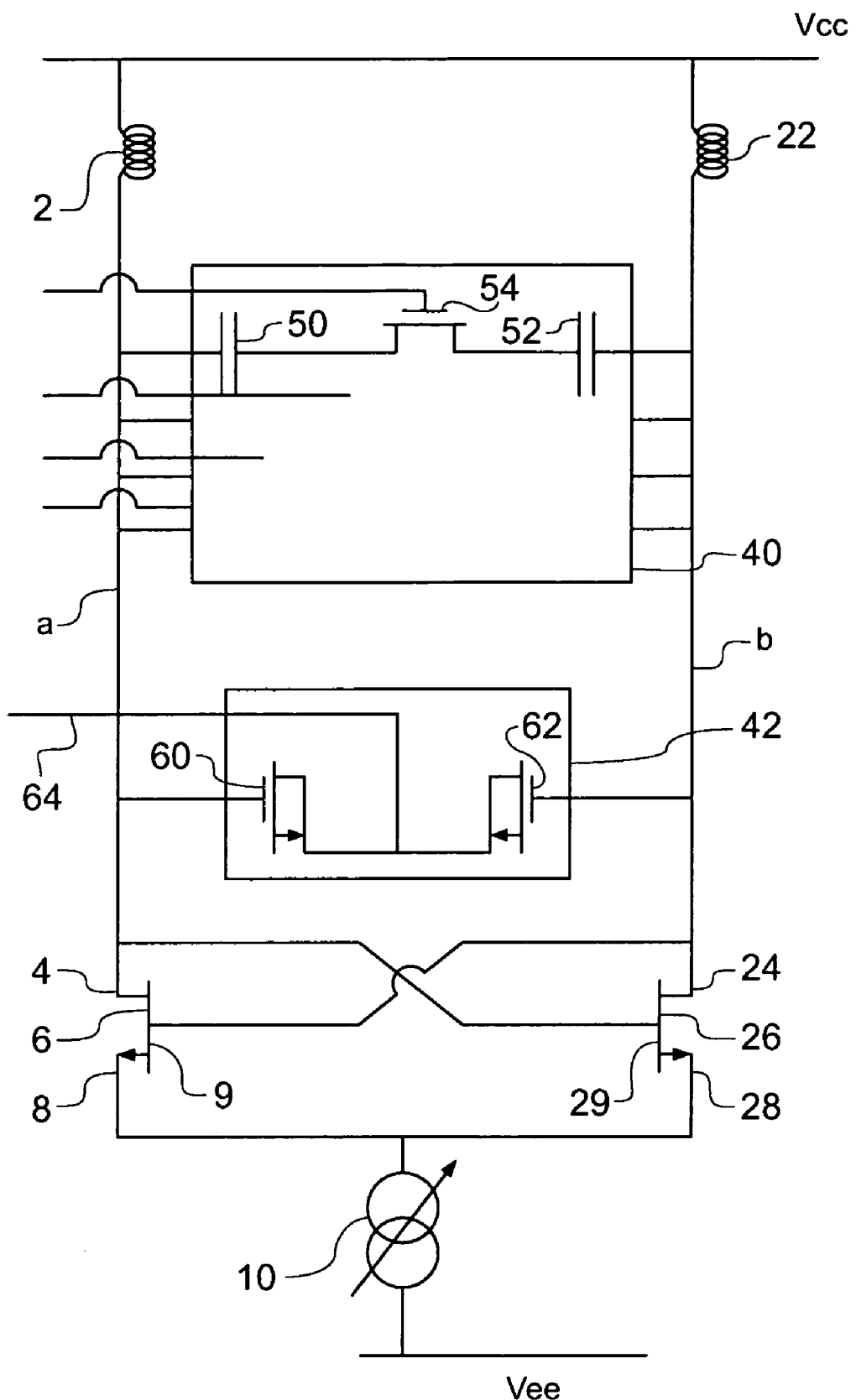
FIG. 1 schematically illustrates a voltage controlled oscillator.

The capacitor selection unit comprises a plurality of capacitors which can be switched into or out of the circuit between the drains 4 and 24 of the field effect transistors. For simplicity only one of the electronically controllable capacitors within the capacitor bank 40 is schematically illustrated in FIG. 1. It can be seen that each one of the electronically controllable capacitors actually comprises two capacitors 50 and 52 disposed either side of a field effect transistor 54. The transistor 54 can be switched on to switch the capacitors into the oscillator circuit, or switched off thereby effectively removing the capacitors from the oscillator circuit, apart for the residual parasitic capacitance that they have. The values of the capacitors within the channels of the switchable capacitance block 40 are advantageously binary weighted so as to simplify control of the tuning range.

Figure 4:
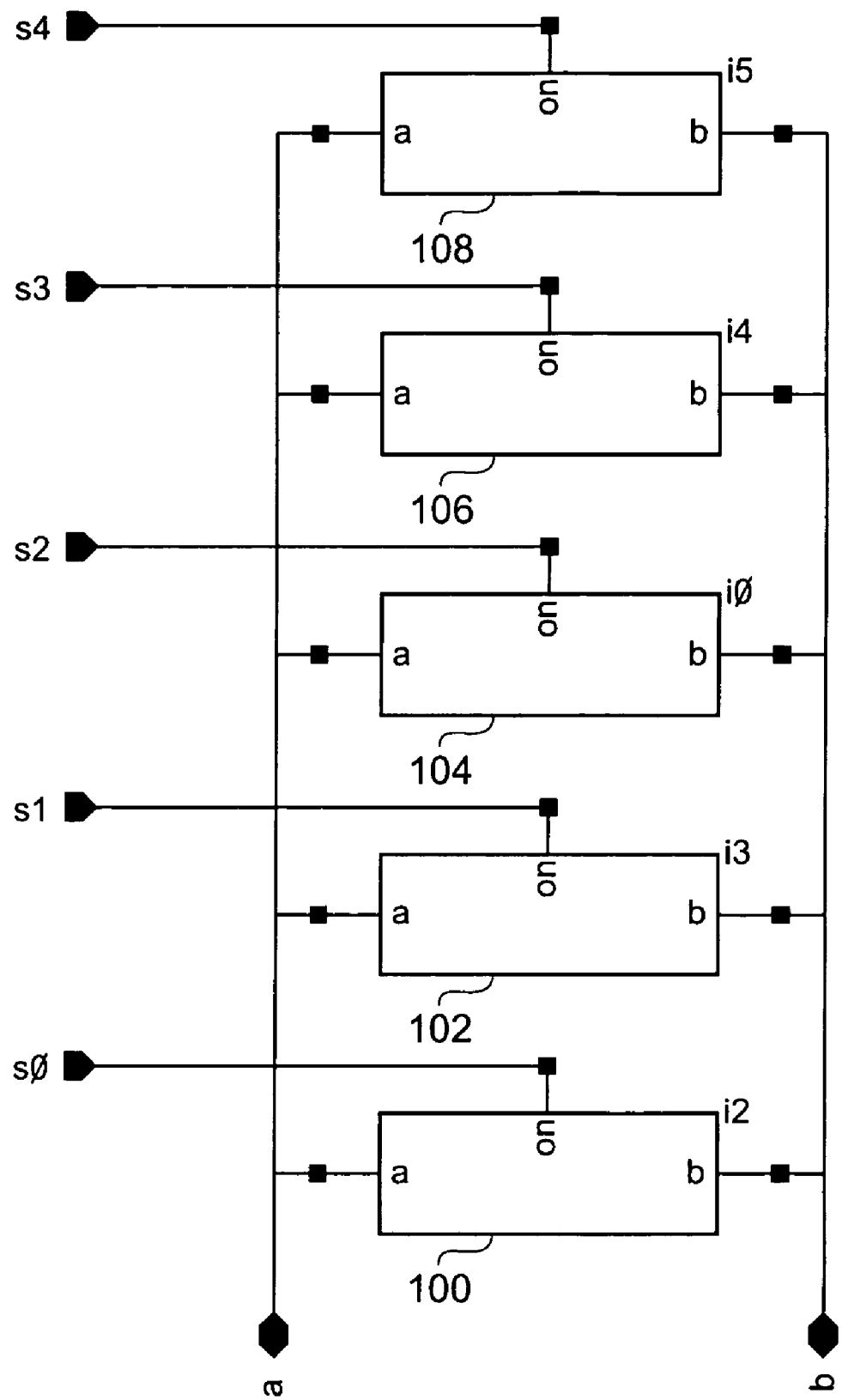
FIG. 4 schematically illustrates the configuration of the coarse tuning block of the oscillator of FIG. 1

The specific details of the capacitor selection unit are shown in more detail in FIG. 4. As shown in FIG. 4, the capacitor tuning block 40 comprises five binary weighted capacitor blocks 100, 102, 104, 106 and 108 arranged in parallel. Each capacitor block has its own select signal S0 to S4 which controls whether the capacitor within the respective block is switched into or removed from the circuit formed between the connections A and B in FIG. 4, which connect to nodes formed between the inductor 2 and transistor 4 on the one hand, and the node formed between the inductor 22 and the transistor 24 on the other hand in FIG. 1. Within each block a field effect transistor and capacitor are connected in series between the nodes A and B of the resonant circuit. Transistor acts merely as a switch in that it is driven to be either in a high impedance or a low impedance state in response to a control signal.

Figure 4A:
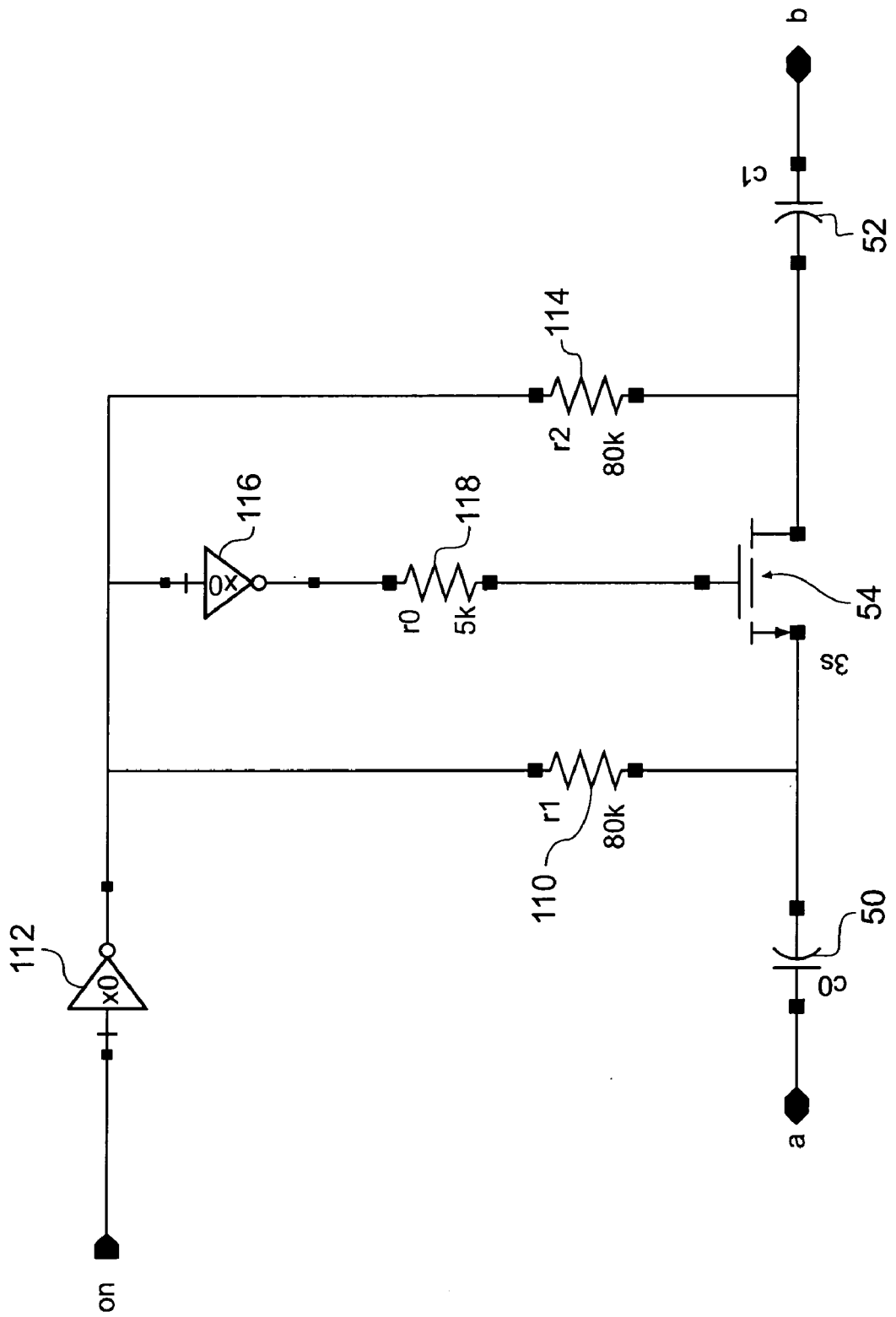
FIG. 4a shows the contents of a capacitor selection block in greater detail.

FIG. 4a illustrates the internal configuration of one of the capacitor blocks in greater detail. As described earlier a capacitor 50, a field effect transistor 54 and a further capacitor 52 are connected in series between the nodes "A" and "B". However in order to ensure consistent operation of the circuit both the source and drain of the field effect transistor 54 are connected via resistors 110 and 114 to the output of an inverter 112 which receives a "capacitor select" signal at its input. The output of the inverter 112 is also provided as an input to a further inverter 116 whose output is connected to a gate of the transistor 54 via a resistor 118. The circuit causes the transistor 54 to be switched hard on thereby minimising the on resistance for a given device size, whilst also allowing the device to be switched hard off, small devices are advantageous as they have reduced parasitic capacitance. Furthermore the circuit is completely balanced.

Returning to FIG. 1, the varactor 42 is of a known design and comprises two field effect transistors 60 and 62. A gate of the transistor 60 is connected to the drain 4 of the first field effect transistor 6 whereas a gate of the transistor 62 is connected to the drain 24 of the second field effect transistor 26. The drains and sources of the transistors 60 and 62 are connected together and also to a varactor control line 64. The voltage between the gate and the drain and source of each of the transistors 60 and 62 can be considered as effectively changing the dimensions between the insulated gate and the conducting channel (which is effectively one of the plates of the capacitor) within each of the transistors 60 and 62 thereby giving rise to the variation of the capacitance exhibited by the varactor 42.

Figure 2:
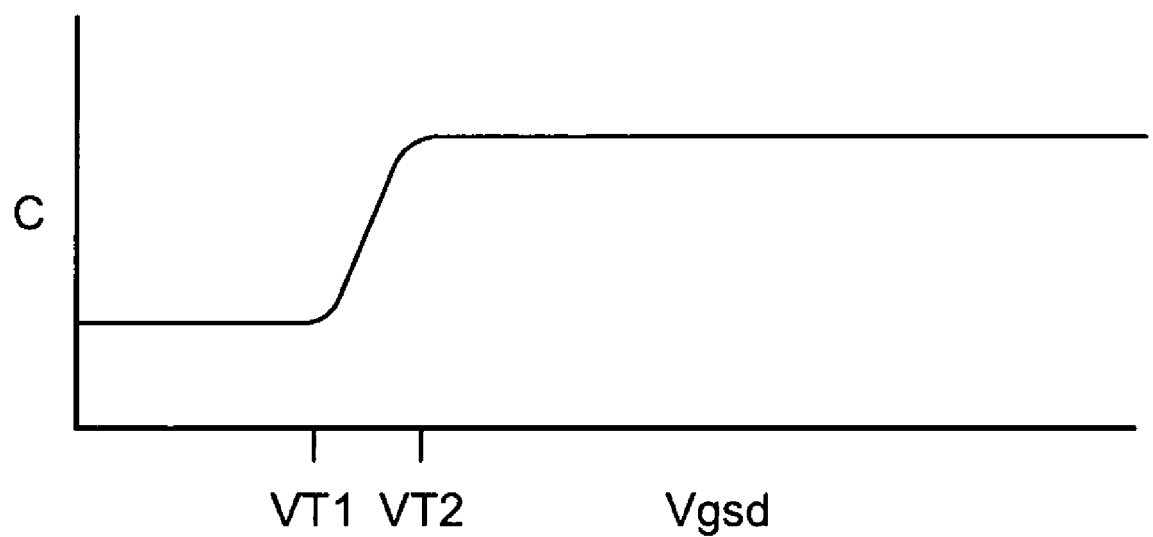
FIG. 2 schematically illustrates a capacitance exhibited by the varactor tuning elements of the oscillator shown in FIG. 1.

Ideally the change of capacitance of the varactor with respect to a control voltage on the control line 64 would be linear. FIG. 2 schematically illustrates the response of the varactor. In FIG. 2 the abcissa represents the control voltage applied to the varactor which is the voltage between the gate and the source/drain of each of the transistors 60 and 62 (the sources and drains being coupled together). The ordinate of FIG. 2 represents the capacitance of the varactor. It can be seen that as the control voltage rises from zero towards a first threshold VT1 the capacitance of the varactor remains essentially unchanged. The capacitance then rises steeply as the control voltage rises from VT1 towards VT2. For control voltages above VT2 the capacitance increases only very slowly with increasing control voltage. The voltages VT1 and VT2 are relatively close together and hence the varactor response can be considered as having an essentially digital response with a short transition region in the range VT1 to VT2.

Figure 3:
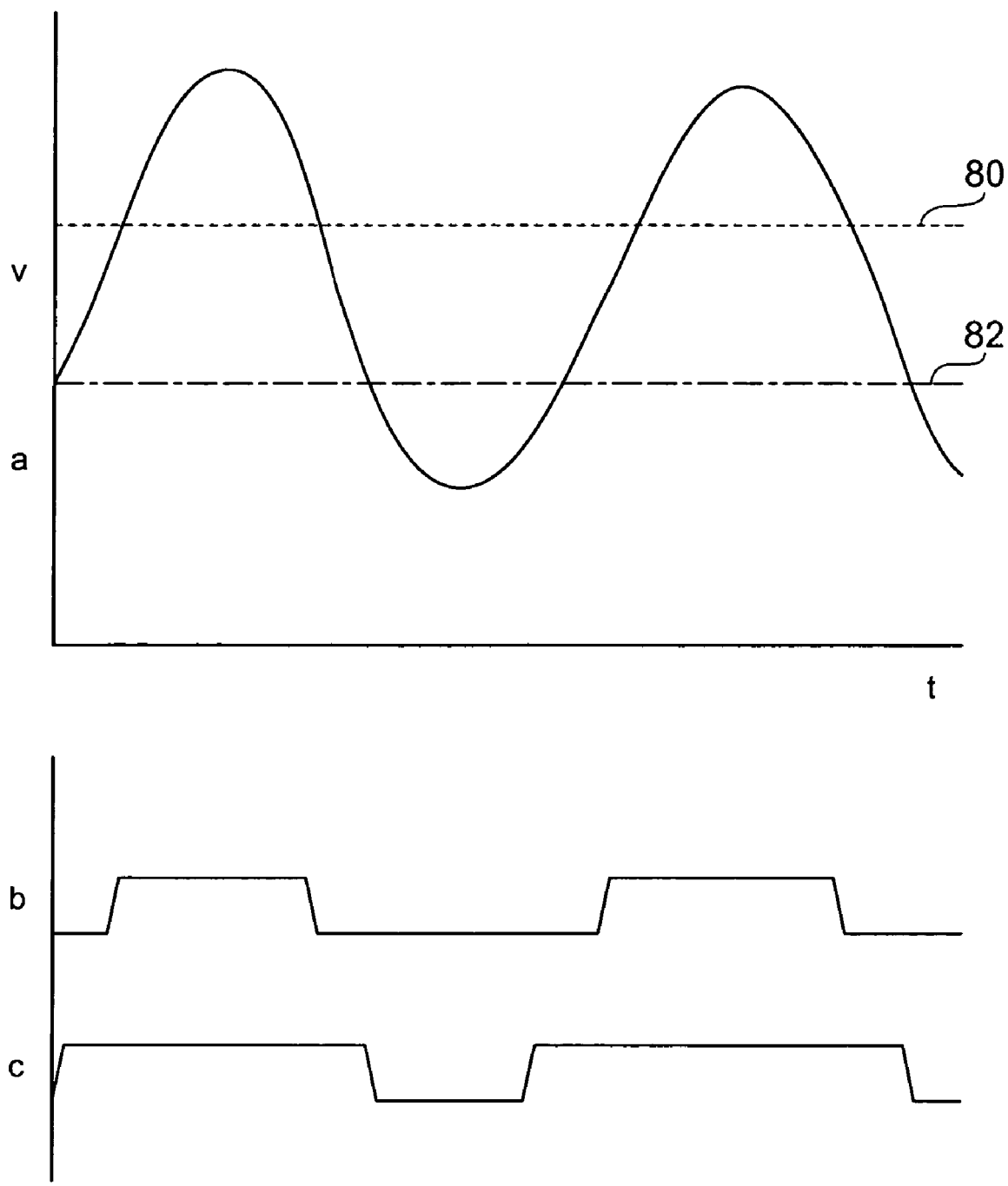
FIG. 3a schematically illustrates the peak to peak output voltage occurring at the input to one of the varactor elements compared to a switching voltage of the varactor.
FIGS. 3b and 3c illustrate the capacitance of the varactor over a cycle of operation of the oscillator for differing varactor control voltages.

FIG. 3a schematically illustrates the voltage occurring at the drain of one of the transistors 6 and 26 with respect to time. Also schematically illustrated on FIG. 3a are two voltages 80 and 82 which represent differing control voltages applied on the varactor control line 64. However it will be appreciated that the varactor does not in fact respond solely to the voltage on its control line 64 but in fact responds to the voltage difference between the voltage on the control line 64 and the voltage at the gates of the transistors 60 and 62. Consequentially the varactor responds to the sum of the alternating voltage and the DC control voltage. Consequently, over an operating cycle of the voltage controlled oscillator, the varactor can be turned on and off, as shown in FIG. 3b and FIG. 3c with the mark-space ratio between the on periods and the off periods being varied by changing the DC control voltage on the input line 64. FIG. 3b shows the consequence of having a relatively low control voltage on the control line 64 such that the sum of the control voltage and the output voltage from the oscillator only exceeds the switching threshold for a relatively short period of time, that is when the voltage across the varactor's transistor exceeds the threshold represented by the chain line 80. FIG. 3c shows the effect of having a larger DC input voltage on the control line 64 such that the varactor switching voltage is exceeded when the output of the oscillator exceeds the threshold indicated by the chain line 82. Thus in FIG. 3c the varactor spends longer in its higher capacitance regime than is the case in FIG. 3b. This means that, averaged out, the varactor in the FIG. 3c regime has a higher capacitance than that in the FIG. 3b regime and consequently the oscillating frequency of the voltage controlled oscillator will be reduced compared to the FIG. 3b regime.

As noted hereinbefore, gross frequency selection is determined by selecting or deselecting the various capacitors within the capacitor bank 40. The selection and deselection of such capacitors results in changes in the components contributing to the oscillator circuit, and this invariably leads to changes in the quality factor, Q, of the oscillator. This in part can be visualised as resistive losses within the switching transistor 54. These changes in quality factor give rise to changes in the amplitude of the oscillator output. Changes in the amplitude of the oscillator output give rise to variations in the time for which the voltage VGSD across the varactor exceeds the switching threshold and hence it becomes apparent that the frequency of the voltage controlled oscillator is dependant upon the amplitude of the output of the voltage controlled oscillator.

Consequently, in order to obtain good frequency control it is necessary for the amplitude of the voltage control oscillator to be stabilised. It should be noted that changes in output amplitude of the VCO effectively change the proportionality constant $K_{VCO}$ of the oscillator and this in turn varies the loop gain of a phase locked loop, PLL, used to control the operating frequency of the VCO.

There are two operating regimes of the circuit shown in FIG. 1 which give rise to control or limitation of the amplitude of the voltage oscillations, and hence the output, of the VCO. The first limiting regime is a current limiting regime. The voltage across each of the inductors 2 and 22 is given by $$V = L\frac{di}{dt}$$

Where $$\frac{di}{dt}$$

is the rate of change of current through the inductor.

Given that the oscillator has a nominal switching frequency it follows that the rate of change of current $$\frac{di}{dt}$$

is limited by the bias current supplied from the current source 10. Thus the voltage waveform developed across the inductors 2 and 22 can be controlled by varying the current flowing through the current source 10.

An alternative limiting regime is a voltage control regime which occurs because the current source 10 will, in reality, be built using transistors and these will require a minimum voltage head room across them in order to operate properly. Consequently, as the amplitude of oscillation increases the voltage head room across the current source 10 decreases. Eventually the head room across the current source 10 decreases to such an extent that it ceases to function correctly. This necessarily results in limitation of the voltage control oscillator output voltage.

Both of these amplitude limiting processes are analog processes and essentially unpredictable. It therefore becomes necessary to control the current mirror by way of a feedback circuit.

It might be supposed that this would best be done in the analog domain. Thus the peak to peak amplitude of the oscillation within the voltage control oscillator would be measured using a peak to peak detector and this voltage would be supplied to a first input of an error amplifier. The second input of the error amplifier would receive a reference voltage and the output of the error amplifier would be a function of a difference between the measured peak to peak voltage and the target peak to peak voltage. The output of the error amplifier is then provided to a control input of the variable current source 10 so as to stabilise the amplitude of oscillation of the VCO.

Whilst this technique is satisfactory from the point of view of amplitude control, it is unsatisfactory with regard to the noise performance of the voltage control oscillator. The very fact that the feedback is continually trying to stabilise the output voltage introduces noise into the circuit by way of the current source. Noise in the current source results in noise in the amplitude of oscillation of the oscillator. Noise in the amplitude of oscillation is, by virtue of the process schematically illustrated in FIGS. 3a to 3c converted to noise in the phase domain of the VCO. This noise degrades phase performance of the VCO and may in fact preclude the device from meeting the stringent phase noise requirements laid down in the GSM specification. Similar oscillator performance requirements are found in other telecommunication systems.

The inventors have realised that, in order to obtain an acceptable phase noise performance from a circuit shown in FIG. 1, analog control of the current source in order to control oscillator amplitude is undesirable.

The inventors have realised that digital control of the current source provides enhanced phase noise performance. This is because the periodic nature of digital control means that for the majority of the time that the current source is running, the current control signal to the current source is invariant. The unchanging nature of the current control signal means that the control signal does not become a source of noise in the current supplied by the current source and consequently does not get converted to phase noise by virtue of the action of the VCO. Within a time domain multiplexed system the changes in the bias current may be constrained to occur when the telephone is not engaged in transmitting and/or receiving.

Within a CDMA system such constraints are not so easily achieved, in which case the size of change of oscillator bias current should be constrained so as not to cause the received or transmitted symbols to become corrupted.

Figure 5:
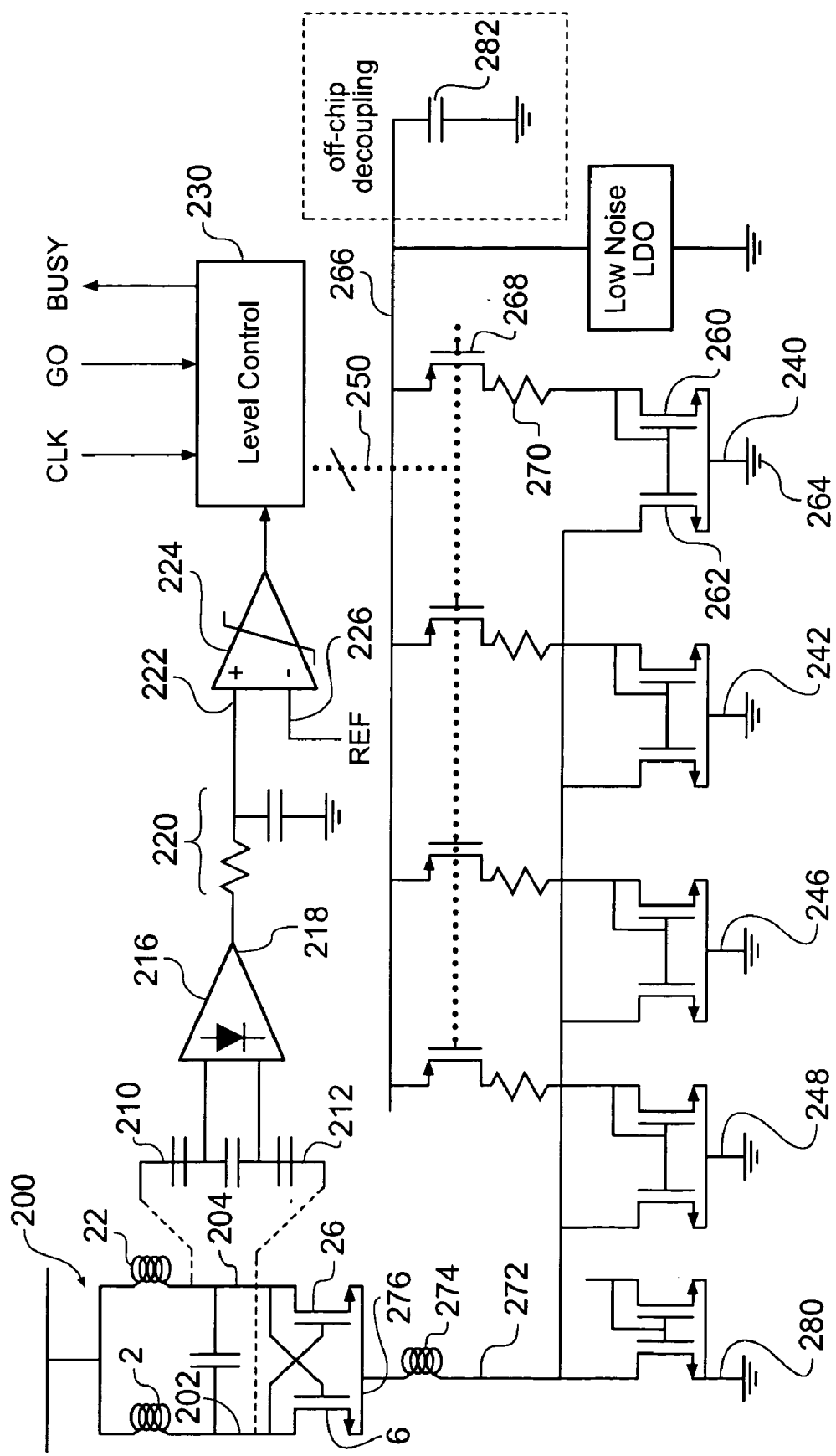
FIG. 5 schematically illustrates an oscillator output level control circuit.

FIG. 5 schematically shows an oscillator and level control circuit (which forms part of an oscillator controller) constituting an embodiment of the present invention. The oscillator, generally indicated 200, is of the type described hereinbefore with reference to FIGS. 1 to 4. Connections are made to nodes 202 and 204 representing the connection between inductor 2 and transistor 6 in a first side of the oscillator 200 and between inductor 22 and transistor 26 in a second side of the oscillator 200, respectively. The connections from nodes 202 and 204 extend, via decoupling capacitors 210 and 212 to first and second inputs of a rectifier 216 which rectifies the voltage difference to obtain a measure of the peak to peak amplitude of the output of the oscillator. An output 218 of the rectifier 216 is supplied via a low pass filter 220 to a non-inverting input 222 of a comparator 224. An inverting input 226 of the comparator 224 receives a reference input indicative of the target amplitude of the oscillator 200. An output of the comparator is provided to a level controller 230 which provides control signals to a plurality of digitally controllable current mirrors 240, 242, 244, 246 and 248 via a control bus 250. It will be appreciated that more current mirrors can be provided if desired. The current mirrors have a common structure and, for brevity, only the first current mirror 240 will be described in detail. The mirror 240 comprises a pair of matched transistors 260 and 262 whose gates are coupled together. The transistors 260 and 262 also have their source terminals coupled together and to the local ground connection 264. The drain terminal of the transistor 260 is connected to a supply rail 266 via an electrically controlled switch 268 and a current control resistor 270. The drain terminal of transistor 262 is connected to the oscillator 200, and more particularly to a node 272 at an input of an inductor 274 which in turn connects to a node 276 to which the sources of the transistors 6 and 26 are connected. The inductor 274 is beneficial as it presents a high impedance to oscillations propagating into the current mirror. Other current control configurations are possible, such as merely switching resistors into the path between the oscillator and ground, or switching resistors into and out of the reference arm of the current mirror 240. The biasing scheme is simple in that it does not include temperature compensation and has low supply rejection.

As noted hereinbefore, all of the current mirrors have the same configuration, but the values of the current control resistors vary between the mirrors. The current mirrors are advantageously binary weighted. If mirror 240 is the most significant mirror, then if the resistor 270 in the mirror 240 has a value R, then the current control resistor in the next mirror has a value 2R, such that half the current flows in mirror 242 compared to that flowing in current mirror 240. The value of the current control resistor in the current mirror 246 is 4R, the value of the current control resistor in the next current mirror 248 is 8R, and so on.

A further current mirror 280 is provided whose current is the minimum amount required to sustain operation of the oscillator (plus a margin of safety) and this current mirror 280 is permanently on.

The supply rail 266 could be derived from a voltage reference, but advantageously is the voltage supply rail to the oscillator core 200. In this way, decoupling capacitor 282 plays a dual role, ensuring stability and limiting noise bandwidth at the LDO output (a function which is usually essential) and simultaneously limiting noise bandwidth in the bias generation circuits.

For simplicity the supply to the oscillator core may be via a low drop out voltage regulator (ie a regulator which does not require much voltage headroom) which may be of a relatively simple design. The regulator is advantageously not designed to maximise regulation but instead is designed to minimise noise. This improves phase noise performance of the oscillator.

Figure 6:
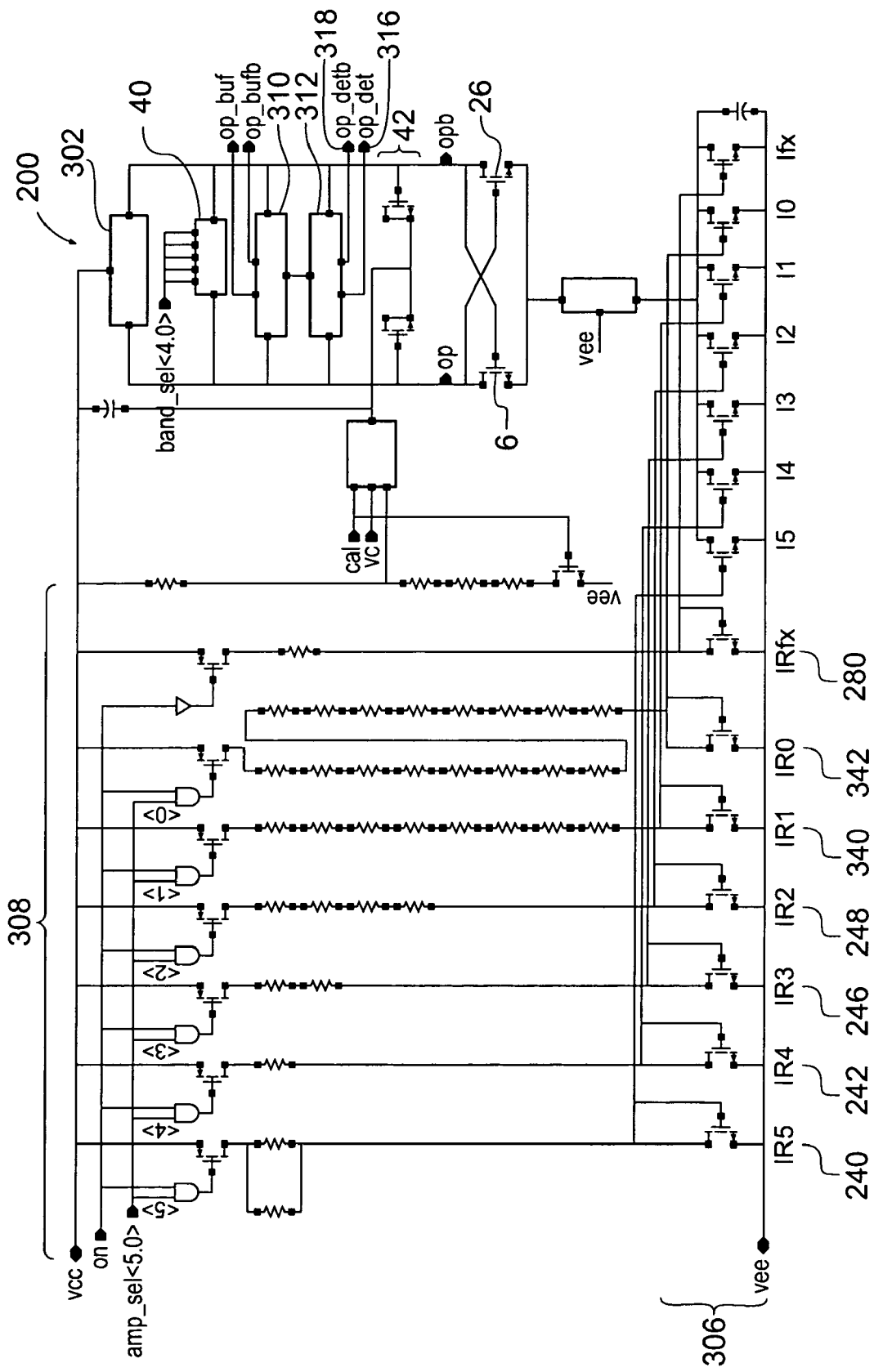
FIG. 6 is a circuit diagram of an embodiment of a level control circuit.
Figure 7:
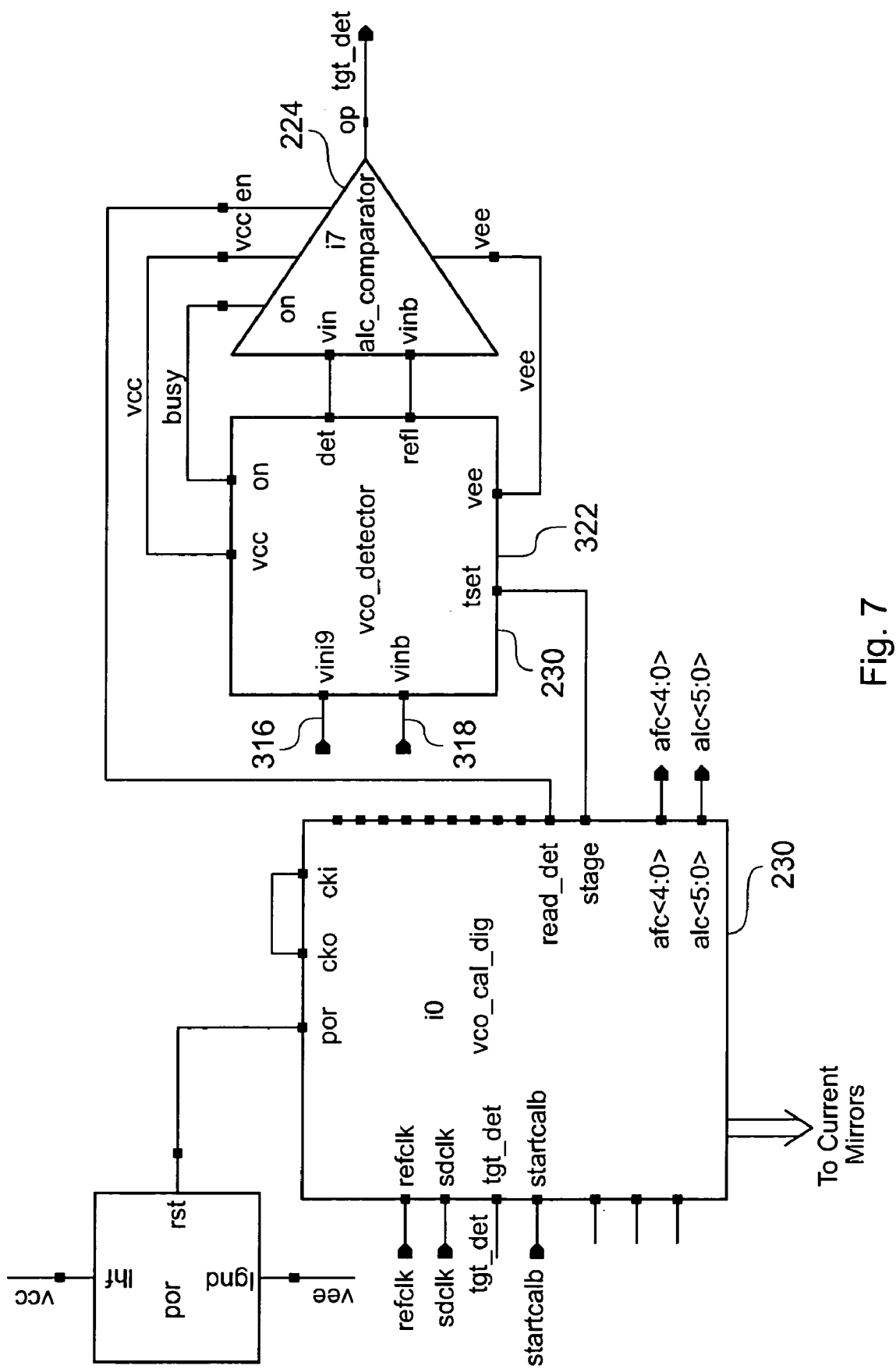
FIG. 7 is a circuit diagram of a level comparator in conjunction with its controller.

FIGS. 6 and 7 show an embodiment of an oscillator in accordance with the present invention and as schematically shown in FIG. 5. The oscillator, generally labelled 200 corresponds functionally with the circuit shown in FIG. 1. The inductors 2 and 22 are implemented within functional block 302, coarse tuning is implemented by the switchable capacitors within the tuning block 40 and fine control is performed by the varactor 42. The cross coupled field effect transistors 6 and 26 receive current from a current mirror generally designated 306. The various transistors within the current mirror 306 are controlled by a switching circuit 308. Returning to the oscillator 200, it further includes a buffer circuit 310 which makes a buffered version of the output of the oscillator available for use in other parts of the telecommunication device. Also provided is a detection tap circuit 312 which provides signals 316 and 318 representing the amplitude of oscillation. The outputs of the detector tap circuit 312 are provided to a further detection element 322, shown in FIG. 7, which serves to rectify and smooth the signals on lines 316 and 318 to produce a composite detected signal.

The detection element 322 also receives a target amplitude from a controller 230 via input 330. The detection element compares the prevailing amplitude with the target value and outputs the result of the comparison to the non-inverting input of a comparator 224. The inverse of the comparison is provided to the inverting input of the comparator 224. The comparator 224 acts to scale and level shift the output of the detection element 320 such that a digital signal suitable for use by other digital circuits is obtained.

The controller 230 (FIG. 7) can control the amplitude of the oscillator by virtue of the current mirror 10 (FIG. 1). The current mirror (shown in detail in FIG. 6) comprises six digitally controllable binary weighted current mirrors 240, 242, 246, 248, 340, 342, together with one permanently on channel 280 which ensures that a minimum value current flow always exists. This is useful as it prevents the oscillator being turned off inadvertently.

The GSM telephone mobile system is a time division multiple access, TDMA, system in which the mobile telephone only transmits or receives during predefined slots. Thus it becomes possible to perform digital control of the oscillator amplitude during the periods where the telephone is not transmitting or receiving and then to suspend amplitude control, that is effectively to go "open loop" during the transmit or receive burst in the TDMA system. However the present invention can also be applied to code division multiple access, CDMA, systems, including 3G telephone systems, where the transmitters and receivers are continuously active. The application of the present invention to CDMA systems is appropriate because the periodic nature of digital systems means that the control word or signal to the current source, ie current mirror 10 is still only periodically updated and hence during the majority of a clock cycle the control signal/word is invariant and hence not a source of noise.

Although the oscillator voltage can vary with temperature and supply voltage it is a reasonable expectation that these vary relatively slowly. Thus amplitude correction need only be performed periodically. In fact, the amplitude correction could be performed once and only once at power up. However, for improved performance it would be expected that it would be repeated every now and again in order to account for temperature changes, for example because heat from the user's hand causes gradual warming of a mobile telephone.

The mobile telephone may have to be frequency agile. For example the GSM telephone system may require the mobile telephone to change operating frequency during the telephone call. If the frequency change is instructed the telephone only has a period of about 200 µs to set its operating frequency before its next transmit cycle.

Manufacturing tolerances and dependence on temperature means that the oscillator configuration shown in FIG. 1, when implanted within a integrated circuit is not wholly predictable. Therefore when selecting a transmission frequency a frequency search through the oscillator frequency space is performed in order to determine the most appropriate selection of capacitors within the coarse tuning unit 40 to be switched into, and indeed out of the oscillator.

Given that the capacitor values within the selection block 40 are binary weighted, the capacitors are switched in and out of the oscillator circuit to perform a successive approximation search of the frequency space. In such a search the most significant, that is largest, capacitor is switched into the circuit and the measurement of the oscillation frequency is made to determine whether the oscillator is higher or lower than the target frequency. If the oscillator is higher than the target frequency then the capacitor remains selected, otherwise it is switched back out of the oscillator circuit. Then the next most significant capacitor is switched into the oscillator circuit and again a frequency measurement is made to determine whether the oscillator frequency is higher or lower than the target frequency. If the oscillator is higher than the target frequency then the capacitor remains selected, otherwise it is removed from the circuit again. This process is repeated for each of the capacitors, it being borne in mind that the selection of each capacitor reduces the operating frequency.

Due to the interrelation of the amplitude and oscillating frequency, the inventors have realised that it is appropriate to interleave amplitude stabilisation with the capacitor frequency search. This is achieved by integrating the tests such that once the first capacitor is switched into the circuit, an amplitude test and stabilisation is performed prior to making the frequency measurements and frequency decision. Indeed, the process can be extended such that once the first capacitor is selected, selection or initiation of the second capacitor test causes the amplitude control to be performed again before the frequency measurement step associated with the second capacitor is performed. The process can also be repeated in respect of the third and subsequent capacitors although it could reasonably be expected that as the capacitor selection moves from the most significant to the least significant capacitor, amplitude variation associated with this process will also reduce. Thus the designer has an option to inhibit the amplitude stabilisation for the least significant capacitors if so desired.

Figure 8:
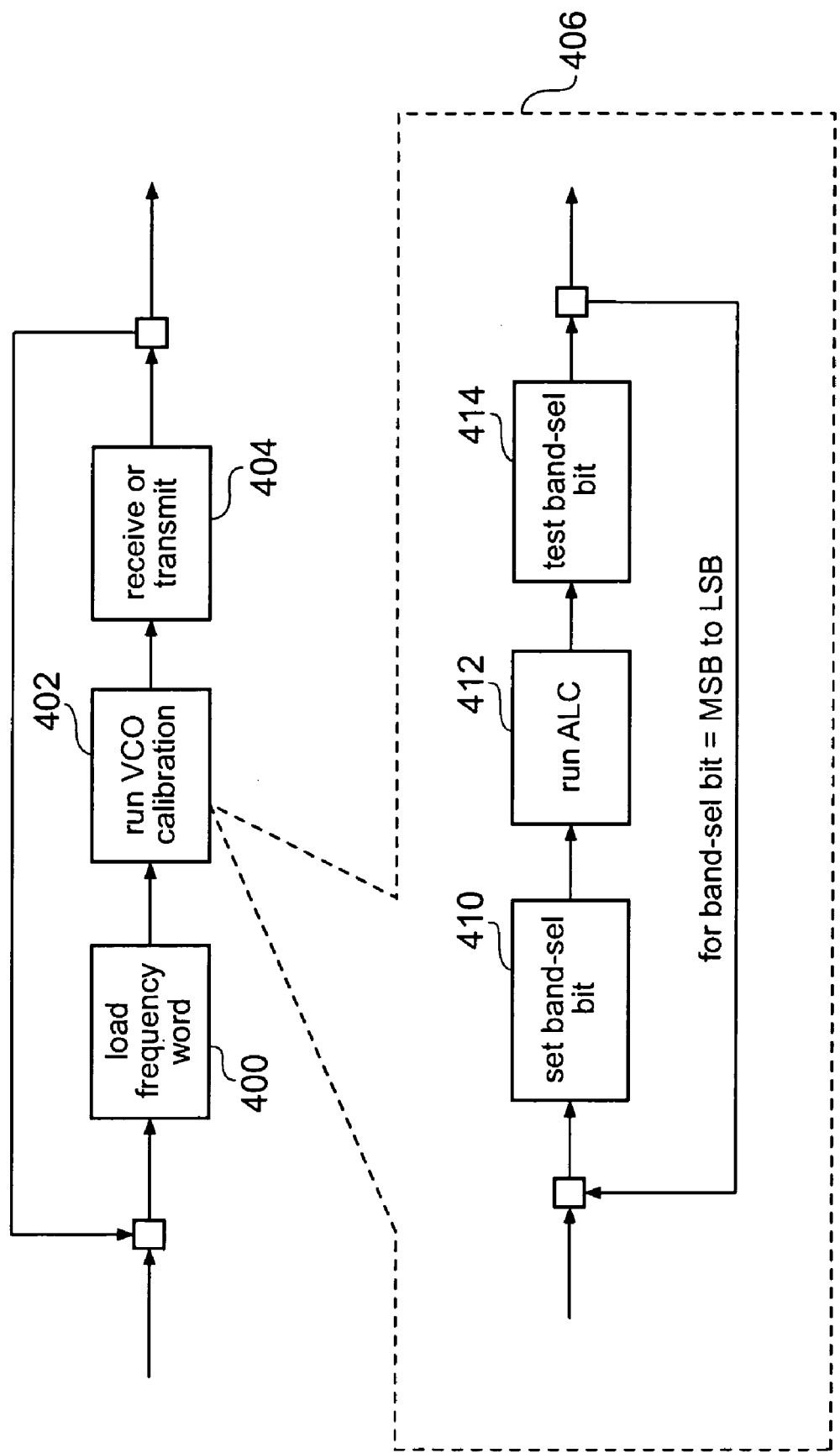
FIG. 8 is a flow diagram of a frequency control and amplitude control scheme.

FIG. 8 is a block diagram schematically illustrating the frequency or band selection and level control procedure as implemented within a mobile telephone constituting an embodiment of the present invention. A controller (not shown) handles the processing of control signals with the mobile telephone infrastructure. Thus, before commencing the procedure shown in FIG. 9 the controller has already received and decoded instructions concerning what frequencies the telephone is to receive and transmit on.

The procedure commences at step 400 where a new frequency word is loaded. This word represents the target frequency of the voltage controlled oscillator. Control then passes to step 402 where the VCO calibration is performed. Once this has been completed control is passed to step 404 where, a transmit or receive operation is performed. From step 404 control can pass to other procedures (not shown) or can be directed by the controller to return to step 400.

Step 402 is in fact an iterative step which itself causes several steps to be performed. Sub-steps to step 402 are schematically illustrated within the outlined box 406 in FIG. 8. The VCO calibration involves a successive approximation search through frequency space to lock the oscillator to a frequency band which includes the desired frequency.

As described hereinbefore, the coarse tuning of the oscillator is controlled by the switching of binary weighted capacitors (although binary weighting is not essential). Fine control can be performed using the varactor. During the frequency selection the varactor is set to its minimum capacitance value. This has the consequence that the varactor can only be used to fine tune the oscillator's frequency is a downwards direction. Other modes are possible, for example the varactor could be set to its maximum capacitance and hence fine frequency control would be in the direction of increasing frequency.

Figure 9:
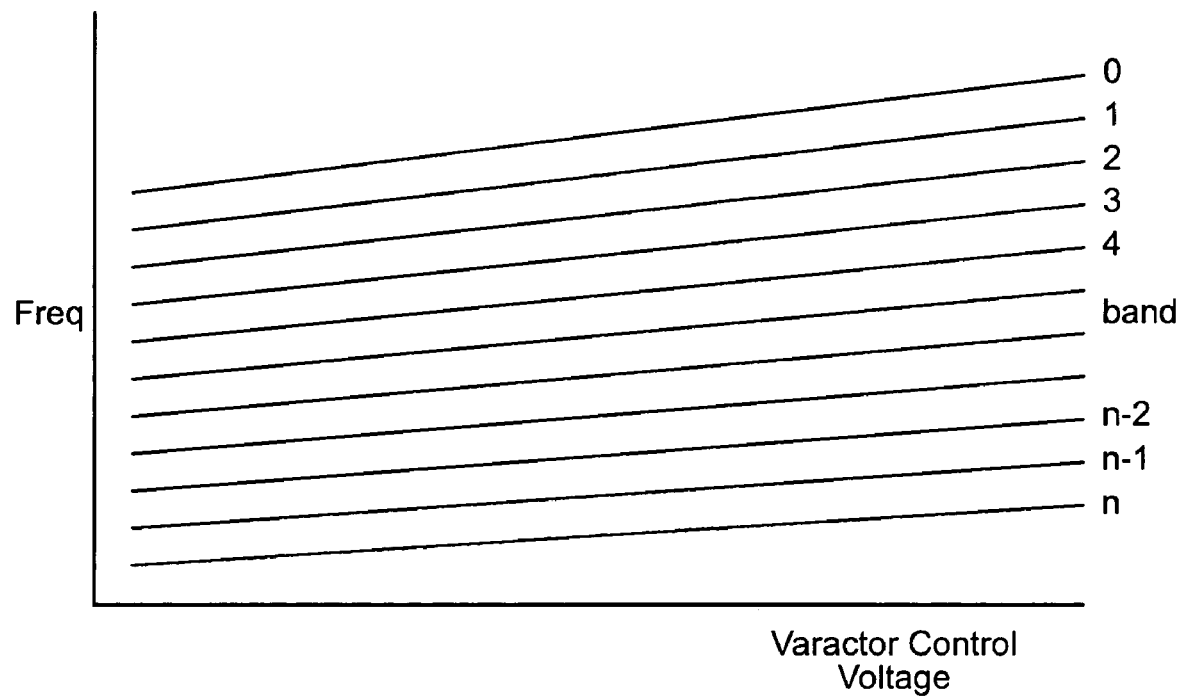
FIG. 9 is a diagram schematically illustrating the frequency range of the bands selectable by the VCO.

FIG. 9 shows how the operating frequency varies with the capacitance control word and varactor voltage. Thus if the capacitance control word is set to 0 corresponding to its minimum value and with all capacitors nominally switched out of the oscillator, then the oscillator will oscillate at its highest frequency. As the control word is increased sequentially towards its maximum value N, then the 1st, 2nd . . . to Nth bands are selected, each having a lower initial frequency than the preceding band. It is important for frequency coverage that the bands overlap with at least the nearest adjacent band so as to ensure that there are no gaps in the operating range between the minimum and maximum frequencies that have to be produced.

Suppose that there are 64 tuning bands, labelled 0 to 63, available. Those can be selected via a 6 bit control word. If we assume that the least significant bit is bit 0, and the most significant bit is bit 5, then the VCO set up procedure performs the frequency search as follows.

The frequency select bits are successively tested from bit 5 to bit 0 by repeatedly running steps 410, 412 and 414 (FIG. 8).

Thus, at step 410 the bit under test of the frequency control word is set. During the first pass through this test this is bit 5. Control is then passed to step 412 where amplitude level control is performed. Once the oscillator amplitude has been set control is passed to step 414 where is a comparison of the oscillator frequency is made with the target frequency as defined by the frequency control word which was loaded at step 400. The comparison is made by measuring the oscillator against a reference frequency provided from a crystal oscillator.

If the oscillator is running at a higher frequency than the target, then the control bit is kept, otherwise it is reset.

The next most significant bit is selected and steps 410, 412 and 414 are repeated. Thus after 6 passes through this process the correct frequency band has been located. Advantageously, if the last frequency control bit (LSB) is not kept, a further amplitude level control cycle might be run to adjust amplitude for the actual band which has been selected.

Oscillator control is then passed to the phase locked loop which locks on to the target frequency and makes fine adjustments of the oscillator frequency via the varactor control voltage.

Figure 10:
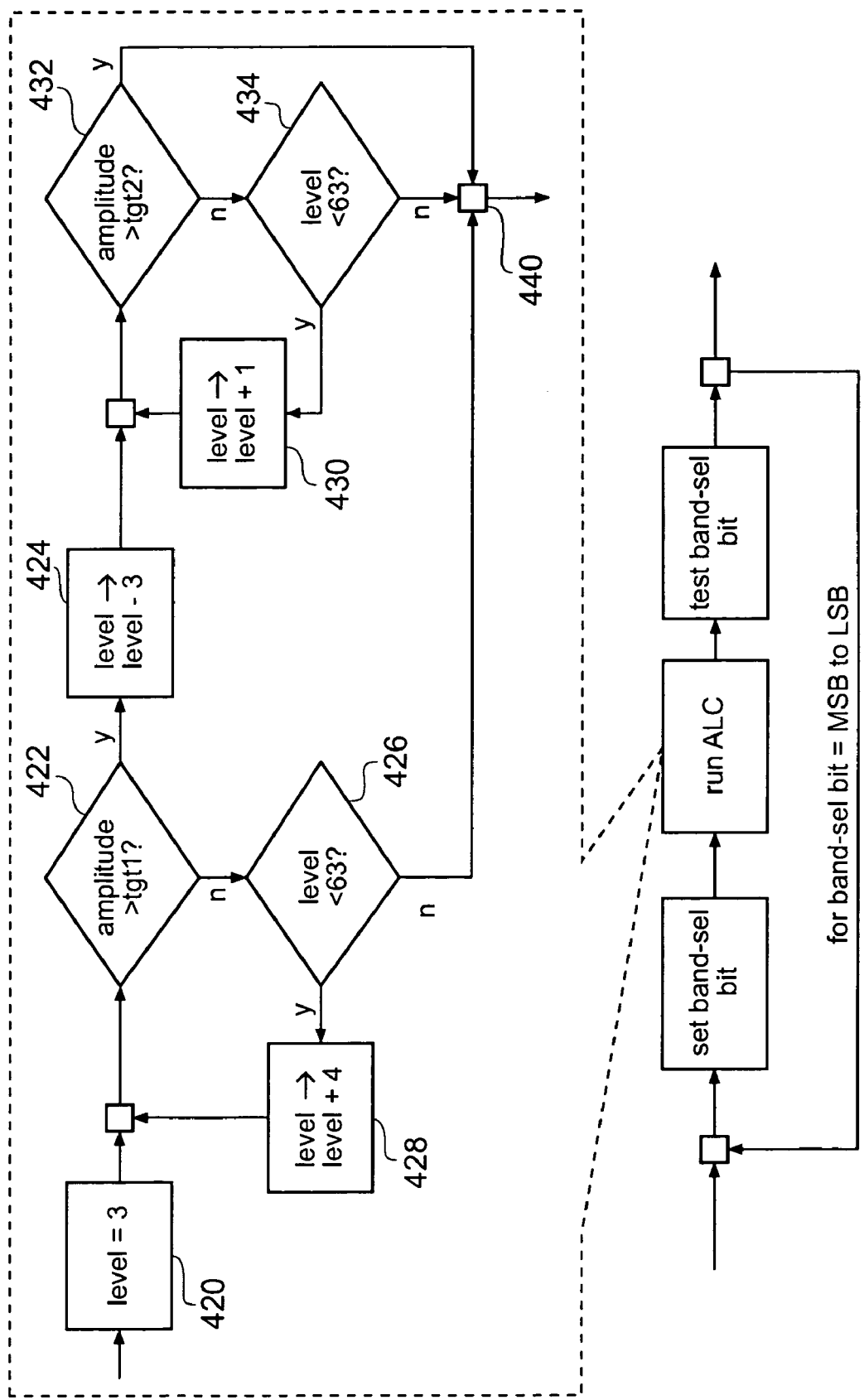
FIG. 10 shows part of the amplitude control scheme in greater detail.

FIG. 10 schematically illustrates the processes performed within step 412 of FIG. 9.

Although a successive approximation search through the amplitude space would be quick, it runs the possibility that the maximum permissible amplitude might be exceeded, and possibly by a large margin. This might be damaging to the components within the oscillator. A slower but safer strategy is to perform a linear search starting from the lowest amplitude and ramping up towards the target amplitude. However, better still is a linear search involving both coarse steps and fine steps of amplitude adjustment. This is both safe and fast. The algorithm schematically illustrated in FIG. 10 performs such a search. The current provided by the current source is controlled by an amplitude control word which has been designated "level". The value of "level" is constrained to lie between zero and 63.

There are two target values TGT1 and TGT2, which are employed during the coarse and fine phases of the search respectively. The value of TGT1 is constrained to be less the maximum safe amplitude minus the maximum expected coarse step size. TGT2 is set equal to the value of the required amplitude minus the equivalent of ½ of the least significant bit.

The algorithm commences at step 420 where "level" is set to an initial value of three. Control is then passed to step 422 where a comparison of the oscillator amplitude is made with a first target value TGT1. A comparison is made at step 422, and if the value of the oscillator amplitude exceeds the first target TGT1, then control is passed to step 424. However, if the value of the oscillator amplitude is still less than TGT1 control passes to step 426 where a test is made on the value of "level". If the value of "level" is less than 63 control is passed to step 428 where the value of "level" is increased by four and control is then returned to step 422. However if the test at step 426 determines that the value of "level" is not less than 63, control is then passed to step 440 which represents an exit from the amplitude control routine.

If step 422 passes control to step 424, then step 424 acts to decrement the value of "level" by three. Control is then passed to step 432 where the oscillator amplitude is compared with the second target, TGT2. The value of the second target TGT2 is set to the required amplitude of the oscillator minus one half the value of the least significant bit of the level control. If step 432 determines that the amplitude is greater than the value TGT2 then control is passed to step 440 which represents the exit from the level setting routine. However if step 432 determines that the oscillator amplitude is less than TGT2 then control is passed to step 434. Step 434 tests the value of "level" and if it is less than 63 then control is passed to step 430, otherwise control is passed to step 440. At step 430 the value of "level" is incremented by one. Control is then passed to step 432.

Figure 11:
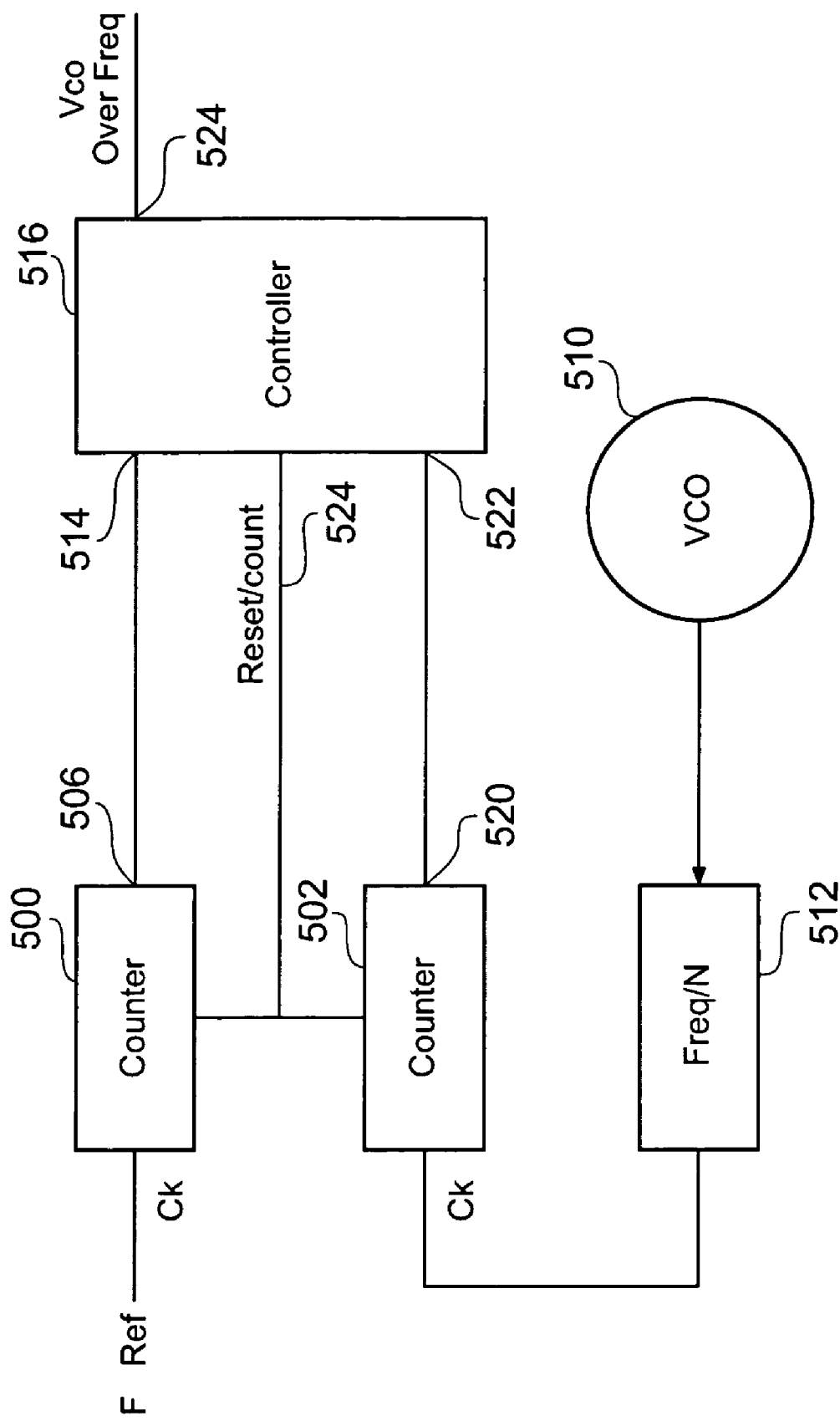
FIG. 11 schematically illustrates a circuit for comparing the oscillator frequency with a reference frequency.
Figure 12:
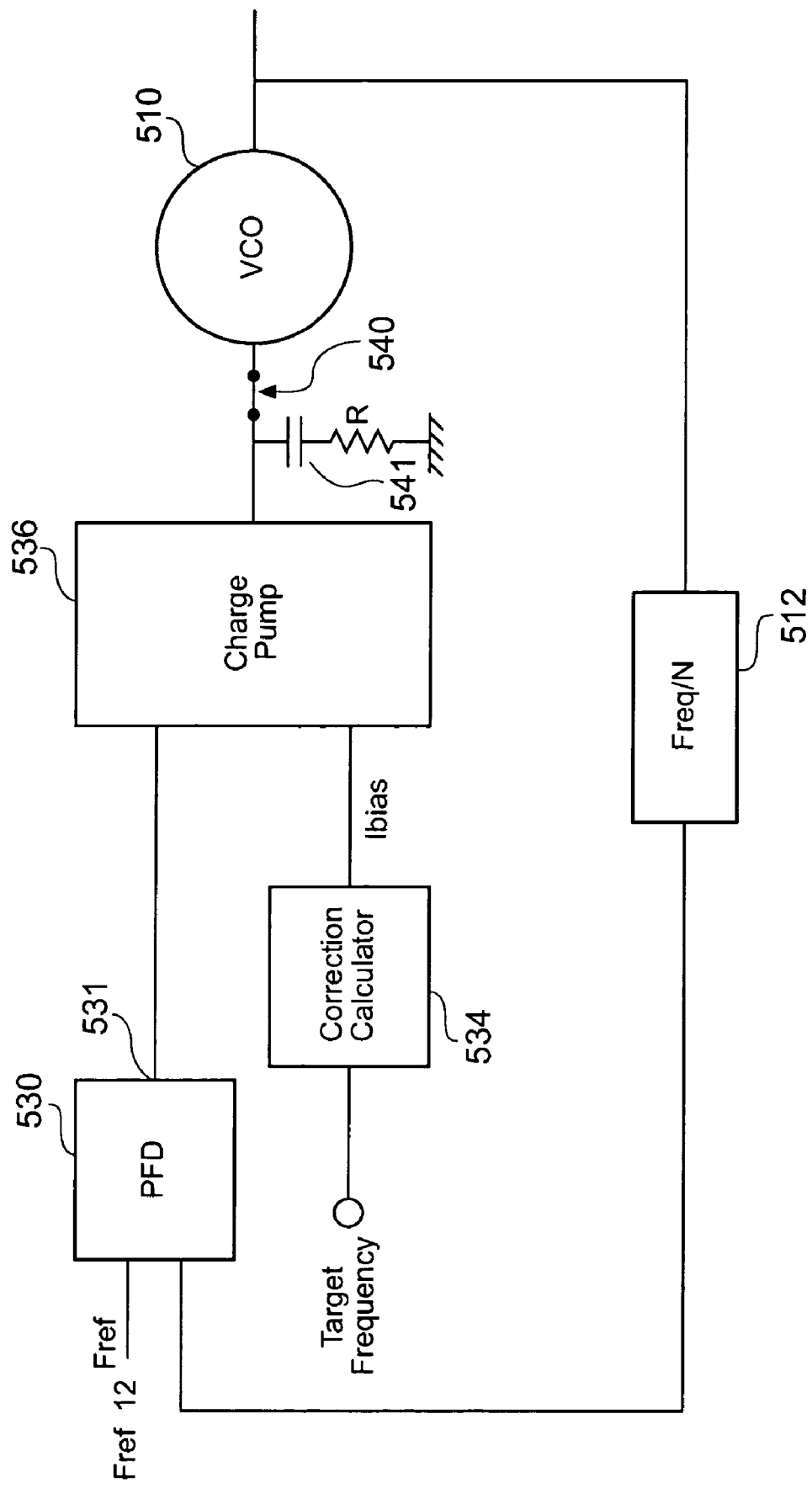
FIG. 12 schematically illustrates a circuit for performing fine frequency control of the oscillator.

FIGS. 11 and 12 schematically illustrate circuits which are suitable for determining the frequency of oscillation of the oscillator shown in FIG. 1. As noted hereinbefore the telephone can be instructed to set its oscillator to any one of a predetermined series of frequencies. The frequencies are not randomly chosen, but in fact are pre-allocated channel frequencies. Each GSM telephone is provided with a highly accurate oscillator which forms a frequency and timing reference for the telephone.

In the circuit shown in FIG. 11 the oscillator controller comprises two counters 500 and 502 which are of an identical construction. The first counter 500 receives the frequency reference signal Fref at a clock input and divides the frequency signal by a predetermined number, for example 32. At the end of this division an output 506 of the counter 500 will change state, for example by going to a logical high. The counter 502 is connected to the voltage controlled oscillator 510 via a fractional divider 512. As noted hereinbefore the target VCO frequency is a multiple of the frequency reference. This multiple of the frequency reference is designated N. Thus, if the fractional divider 512 is programmed to divide by N then the signal provided to the second counter 512 should be at the same frequency as that provided to the first counter 500. Consequently a comparison of the VCO frequency with the target frequency can be performed merely by starting both counters 500 and 502 at the same time, getting them to count the same number of clock pulses, and determining which finishes first. The one that finishes first will be clocked at a higher rate, subject to a small quantization error resulting from the fact that we cannot guarantee that both clocks to counters 500 and 502 were in phase at the start of the count. The output 506 of the first counter 500 is provided to a first input 514 of a controller 516. An output 520 of the second counter 502 is provided to a second input 522 of the controller 516. The controller 516 can reset the counters 500 and 502, or allow them to start counting via a shared control line 524. Thus, the reset/control line 524 may go low to reset the counters, and may be sent high to initiate the count. If the signal is received from the counter 502 before the counter 500 then an output 524 asserting that the voltage control oscillator is running faster than the reference can be asserted.

It is thus possible to provide a relatively simple and reliable circuit configuration for setting the coarse frequency of the voltage controlled oscillator.

FIG. 12 shows the circuit configuration of a phase locked loop for performing the fine frequency control of the voltage controlled oscillator 510. Here, as in FIG. 11, the output of the VCO is divided down by the divider 512. Advantageously, but not necessarily, the divider 512 is a fractional divider. Such a fractional divider generally works by using integer dividers that the swap between different divide ratios such that the average division ratio, N, is fractional. A phase-frequency sensitive detector 530 is provided which receives the frequency reference signal at a first input thereof and the output of the divider 512 at a second input thereof. The phase-frequency sensitive detector, which is a well known component, produces an output 531 representative of the phase difference between its input signals. This signal, whose polarity and optionally magnitude represents the correction to be applied to the voltage controlled oscillator, is supplied to a first input of a charge pump 536. A correction calculator 534 is responsive to a frequency control word from the controller and outputs a correction value to a second input controlling a bias current of the charge pump 536. The output of the charge pump is low pass filtered by a filter 541 and used to control the varactor 42 in the voltage controlled oscillator 510.

The phase-frequency detector and the charge pump are likely to be implemented as digital components. In such circumstances the phase-frequency detector's output will only indicate whether the frequency divided signal leads or lags the reference signal and on this basis charge will either be injected into the low pass filter or removed from the low pass filter (as appropriate) causing the control voltage of the voltage controlled oscillator to rise or fall, respectively. The phase-frequency detector 530 and the charge pump have been shown as separate components although in practice they may be closely coupled or even implemented within a single functional block.

Although the low pass filter has for simplicity been represented in FIG. 12 by a single capacitor, the filter is in general more complex. In preferred embodiments of the invention the filter has been implemented using a first capacitor C1 in series with a resistor R, with the combination being in parallel with a second capacitor C2. Capacitor C2 can be omitted.

In an arrangement having only C1 in series with R as the low pass filter 541, then the loop equations for the PLL can be represented as:

$$G(S) = \frac{K_{VCO} \cdot K_{CP}}{N} \cdot R \cdot \frac{(s + \omega 2)}{s^2}$$

where $$\omega 2 = \frac{1}{R \cdot C1}$$

In the more complex case where C2 is in parallel with the series combination of C1 and R then:

$$G(S) = \frac{K_{VCO} \cdot K_{CP}}{N} \cdot R \cdot \frac{1}{s^2} \cdot \frac{(s + \omega 2)}{(s + \omega 3)}$$

where $$\omega 2 = \frac{1}{R \cdot C1} \quad \omega 3 = \frac{1}{R \cdot (C1 \| C2)}$$

where

G(s) is the open loop transfer function;

$K_{VCO}$ is the VCO gain (rad/s/V)

$K_{CP}$ is the phase detector/charge pump gain (A/rad)

N is the divide ratio

The closed loop transfer function F(s) is given by $$F(s) = \frac{G(s)}{G(s)+1}$$

As mentioned earlier the MOSFET varactor exhibits an instantaneous capacitance which varies with the instantaneous voltage at it's gate electrode, which as shown in FIG. 1 is connected at a node between the first transistor 6 and the inductor 2 (and a corresponding connection between transistor 26 and inductor 22 and a tuning control voltage applied via varactor control line 64 to the source and drain of the MOSFET, which are shorted together.

The capacitance over a cycle of oscillation assumes an average value which is a function of amplitude of oscillation, temperature and frequency—as mentioned earlier. Assuming that frequent amplitude corrections are performed, then the varactor control voltage—frequency characteristic $K_{VCO}$ effectively becomes insensitive to frequency band (i.e. loss in capacitor tank circuit) and temperature. Consequently for a given device $K_{VCO}$ is mainly a function of frequency.

Figure 13:
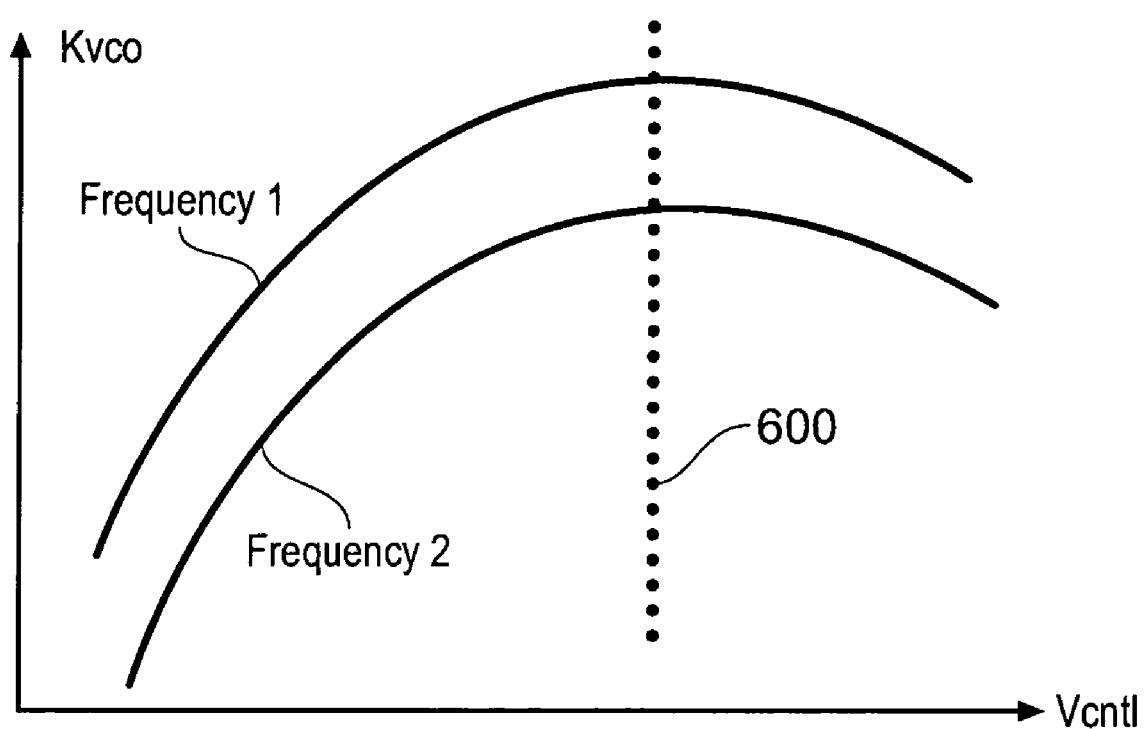
FIG. 13 shows plots of $K_{VCO}$ versus oscillator control voltage.

FIG. 13 shows, on an exaggerated scale how the $K_{VCO}$ varies as a function of varactor frequency control voltage, and how this differs between frequencies Frequency 1 and Frequency 2 (other factors can be used to invoke a frequency change such that the variation of $K_{VCO}$ with respect to varactor control voltage can be investigated).

If the varactor control voltage is kept constant, as represented by the chain line 600, then it is found that $K_{VCO}$ follows a cubic relationship with respect to frequency.

This cubic relationship as a function of frequency is predictable, since for a resonant circuit $$\omega = \frac{1}{\sqrt{LC}}$$

differentiating with respect to C $$\frac{d\omega}{dc} = -\frac{1}{2}(LC)^{-3/2}$$

and substituting back with $\omega=(LC)^{-1/2}$, we see $$\frac{d\omega}{dc} = -K\omega^3$$

where K is a constant.

Furthermore, since dc is proportional to dV, where V is the varactor control voltage (for an amplitude stabilised oscillator) then $$\frac{d\omega}{dV} = K_{VCO} = K_2\omega^3$$

where $K_2$ is a constant.

From the above equation we know that $K_{VCO}$ is proportional to frequency³. However the loop divide ratio N is proportional to frequency (so as the set output of the divider 512 to the reference frequency) and consequently the term $$\frac{K_{VCO}}{N}$$

is proportional to frequency².

The fractional divider divides the oscillator frequency by N, and the analysis indicates that, for example, a 25% fractional tuning range (i.e. frequency within the range can vary by 25%) gives rise to a 56% variation in $$\frac{K_{VCO}}{N}.$$

However, the absolute variation in $K_{VCO}$ when using MOS varactors is fairly small, typically around ±5%. Therefore an additional form of correction is required, and as noted above this is achieved by using the correction calculator 534 to vary the charge pump bias current as a correction based on the frequency control word. Changing the charge pump bias current enables the phase detector/charge pump gain $K_{CP}$ to be varied in a predetermined manner, such as proportional to $$\frac{1}{frequency^2} \text{ or } \frac{1}{N^2}.$$

In this way the product $K_{CP} \cdot K_{VCO}$ can be maintained substantially constant.

The correction calculator 534 can advantageously be implemented as a lookup table as this allows the degree of resolution and the shape of the function that the correction calculator implements to be varied at the designer's will. In general, the correction calculator will implement a function that varies as frequency⁻² to compensate for the change in $K_{VCO}$ with respect to frequency.

The divider 512 is, in general, responsive to a divider control word containing an integer and sub integer portion. The divide control word sets the VCO output frequency via the feedback loop formed by the divider 512, the PFD 530 and the charge pump 536.

It can be seen the action of the control loop is to try to get $$\frac{F_{OUT}}{N}$$

to be equal to the reference frequency $F_{ref}$ $$\therefore F_{out} = F_{ref} \times N$$

For a fractional synthesiser, that is a frequency synthesiser having a fractional divider 512 the control word comprises an integer part and a fractional part.

For simplicity we can call the integer part $N_{int}$, the fractional part $N_{Frac}$ and this is often associated with a modulus or denominator or the fraction M.

So $$F_{out} = F_{ref} \times \left(N_{int} + \left(\frac{N_{Frac}}{M}\right)\right)$$

In general, the system operates in a regime where N>>1 so merely looking at the integer part provides a good way of estimating the output frequency.

The integer part of the control word can be provided as the target frequency input of the correction calculator. The designer can trade accuracy for complexity and select all of the bits of the integer part or merely some of the most significant of them. Similarly the designer may also choose to incorporate some of the bits from the fractional part for greater accuracy.

In use, the frequency control word is provided to the correction calculator which varies the bias current, as a function of a value derived from a look up table.

In a preferred embodiment the charge pump current in changed as function of the frequency word. This is conveniently made by providing a fixed current bias and adding a variable bias from a current mode digital to analog converter.

It is thus possible to provide a voltage controlled oscillator which has low phase noise, and which is relatively inexpensive by virtue of being integrated into an integrated circuit.

This relatively simple scheme provides a way of compensating the variation is loop gain versus frequency within a phase locked loop synthesiser. The system is open loop and hence is simple to implement and highly stable. The correction factor for the loop gain can be derived a priori solely on a knowledge of the target frequency (for a known/characterised implementation of the PLL)

The system has been shown in tests to reduce loop gain variations to below 10%. This is best achieved where the voltage controlled oscillator uses MOS varactors and is output level controlled. It is also advantageous if the charge pump current from the charge pump 536 is selected as a function of resistor value R in a loop filter 541 provided to smooth the charge pump output.

The invention claimed is:

1. An apparatus, for performing frequency compensation of a "constant of proportionality" of a voltage controlled oscillator, comprising a constant of proportionality modifier for modifying the constant of proportionality used in a frequency control loop as a function of a target frequency of the voltage controlled oscillator, in which the constant of proportionality modifier produces a correction signal which varies as the square of the target oscillator frequency.

2. An apparatus as claimed in claim 1, in which a loop gain correction is solely a function of the desired target frequency.

3. An apparatus as claimed in claim 1 in which, for a given combination of phase detector, charge pump and voltage controlled oscillator, a loop gain correction is solely a function of a target frequency.

4. An apparatus as claimed in claim 1, in which a loop gain correction is performed by modifying a bias current of a charge pump used to provide a control voltage to a voltage controlled oscillator.

5. An apparatus as claimed in claim 1, further including a filter for low pass filtering an output of the charge pump.

6. An apparatus as claimed in claim 1, in which the constant of proportionality modifier includes a look-up table in order to derive the correction signal.

7. An apparatus as claimed in claim 1, wherein the constant of proportionality is a loop gain of a phase locked loop.

8. An apparatus as claimed in claim 1, in which the output of the voltage oscillator is divided in frequency by a divider to form a divided signal, and the frequency of the divided signal is compared with a reference frequency and the result of the comparison is used to control a charge pump for generating a control signal of the voltage controlled oscillator.

9. An apparatus as claimed in claim 8, in which a bias current for the charge pump is modified by the constant of proportionality modifier.

10. A method of performing frequency compensation of the constant of proportionality of a voltage controlled oscillator within a phase locked loop, the method comprising the steps of:
1) receiving a target frequency for the voltage controlled oscillator;
2) deriving a correction value based on the target frequency;
3) performing amplitude correction so as to set the amplitude to a desired value; and
4) supplying the correction value for use, either directly or indirectly, by the voltage controlled oscillator, wherein the correction value varies as (target frequency)$^{-2}$.

11. A method as claimed in claim 10, in which the correction value is used to control a bias current of a charge pump used within the phase locked loop to generate a control voltage for the voltage controlled oscillator.

12. A method of performing frequency compensation of the constant of proportionality of a voltage controlled oscillator, the method comprising forming a frequency error signal, using the frequency error signal to drive the oscillator, and using a target frequency to derive a constant proportionality for converting the error signal into a frequency change of the voltage controlled oscillator, where the constant of proportionality is corrected by a correction factor which varies as (frequency)$^{-2}$.

13. An apparatus for compensation for variations in loop gain of a phase locked loop as a function of frequency, comprising a correction calculator for introducing a loop gain correction which varies as the inverse square of a target frequency of an oscillator controlled by the phase locked loop.

14. An apparatus as claimed in claim 13, in which loop gain control is performed by modifying a bias current of a charge pump used to provide a control voltage to a voltage controlled oscillator.

15. An apparatus for compensating for variations in loop gain of a phase locked loop as a function of frequency, comprising a correction calculator for introducing a loop gain correction as a function of target frequency squared of an oscillator controlled by the phase locked loop.

16. An apparatus for compensating for variations in loop gain of a phase locked loop as a function of frequency, comprising a correction calculator for introducing a loop gain correction as a function of a target frequency of an oscillator controlled by the phase locked loop, wherein the phase locked loop further includes a frequency divider having a divide ratio of N, and the gain correction varies as a function of $N^2$.

17. An apparatus as claimed in claim 16, in which a correction factor varies as $1/N^2$.

18. An apparatus for performing frequency compensation of a "constant of proportionality" of a voltage controlled oscillator, comprising a constant of proportionality modifier for modifying the constant of proportionality used in a control loop as a function of a target frequency of the voltage controlled oscillator, wherein the constant of proportionality modifier produces a correction signal which varies as (target frequency)$^{-2}$.

19. A method for performing frequency compensation of a "constant of proportionality" of a voltage controlled oscillator, comprising providing a constant of proportionality modifier for modifying the constant of proportionality used in a frequency control loop as a function of a target frequency of the voltage controlled oscillator, in which the constant of proportionality modifier produces a correction signal which varies as the square of the target oscillator frequency and the correction signal is applied to the voltage controlled oscillator.

20. The method of claim 19 wherein said correction signal is solely a function of the desired target frequency.

21. The method of claim 19 wherein said correction signal modifies a bias current of a charge pump used to provide a control voltage to said oscillator, which is a voltage controlled oscillator.

22. The method of claim 19 wherein the constant of proportionality modifier includes a look-up table for deriving the correction to the control signal.

23. The method of claim 19 wherein the constant of proportionality is the loop gain of a phase locked loop.

24. The method of claim 19 further including dividing the output of the voltage oscillator by a frequency divider to form a divided signal and comparing the frequency of the divided signal with a reference frequency and using the result of the comparison to control a charge pump for generating a control signal for the voltage controlled oscillator.

25. The method of claim 24 in which a bias current for the charge pump is modified by the constant of proportionality modifier.

26. A method of controlling a voltage controlled oscillator within a phase locked loop, the method comprising the steps of:
1) receiving a target frequency for the voltage controlled oscillator;
2) receiving a target amplitude for the voltage controlled oscillator;
3) adjusting the amplitude of the voltage controlled oscillator so as to set it within an acceptable range of the target amplitude,
4) forming a frequency error signal representing a difference between the target frequency of the voltage controlled oscillator and an actual frequency of the voltage controlled oscillator;
5) using the frequency error signal to form a control signal for the oscillator; using the target frequency to derive a correction to vary a loop gain of the phase locked loop as a function of the target frequency, in which the correction of the loop gain varies as (target frequency)$^{-2}$.

27. A method as claimed in claim 26 where the loop gain correction of the phase locked loop is an open correction.

28. A method as claimed in claim 26 in which the loop gain correction is solely a function of the desired target frequency.

29. An apparatus for controlling a voltage controlled oscillator, the apparatus comprising:
a phase frequency detector;
a phase locked loop comprising a programmable frequency divider and a charge pump;
an amplitude controller for the voltage controlled oscillator; and
a correction calculator,
wherein upon receipt of a target frequency for the voltage controlled oscillator and a target amplitude:
a) the amplitude controller adjusts the voltage controlled oscillator amplitude to set it within an acceptable range of values;
b) the programmable divider is set to a divide ratio N such that the target frequency $F_{out}=F_{ref} \times N$, where $F_{ref}$ is a reference frequency supplied to the phase frequency detector;
c) the phase frequency detector compares the output of the programmable divider with the reference frequency and generates an error signal;
d) the error signal is provided to the charge pump an output of which is connected to a control terminal of the voltage controlled oscillator; and
e) the target frequency is further provided to the correction calculator, which derives a correction to vary the loop gain of the phase locked loop according to the target frequency, in which the loop gain varies as (target frequency)$^{-2}$.

30. An apparatus as claimed in claim 29 in which correction from the correction calculator is used to modify a bias current of the charge pump.

31. An apparatus as claimed in claim 29 in which the loop gain correction of the phase locked loop is an open loop correction.

32. An apparatus as claimed in claim 29 in which the loop gain correction is solely a function of the target frequency.

33. An apparatus for controlling a voltage controlled oscillator having an inductor—capacitor resonant circuit therein, the apparatus comprising:
a phase frequency detector;
a phase locked loop comprising a programmable frequency divider and a charge pump;
an amplitude controller for the voltage controlled oscillator; and
a correction calculator,
wherein upon receipt of a target frequency for the voltage controlled oscillator and a target amplitude:
a) the amplitude controller adjusts the voltage controlled oscillator amplitude to set it within an acceptable range of values;
b) the programmable divider is set to a divide ratio N such that the target frequency $F_{out}=F_{ref} \times N$, where $F_{ref}$ is a reference frequency supplied to the phase frequency detector;
c) the phase frequency detector compares the output of the programmable divider with the reference frequency and generates an error signal;
d) the error signal is provided to the charge pump an output of which is connected to a control terminal of the voltage controlled oscillator; and
e) the target frequency is further provided to the correction calculator, which derives a correction to vary the loop gain of the phase locked loop according to the target frequency, in which the loop gain varies as (target frequency)$^{-2}$.

* * * * *

UNITED STATES PATENT AND TRADEMARK OFFICE
CERTIFICATE OF CORRECTION

PATENT NO. : 7,492,228 B2
APPLICATION NO. : 11/362935
DATED : February 17, 2009
INVENTOR(S) : Jonathan Richard Strange It is certified that error appears in the above-identified patent and that said Letters Patent is hereby corrected as shown below:

In Claim 12, column 20, line 29, delete "(frequency)$^{-2}$" and insert -- (target frequency)$^{-2}$ --

In Claim 26, column 21, line 33, delete "amplitude," and insert -- amplitude; --

Signed and Sealed this

Thirteenth Day of July, 2010

David J. Kappos
*Director of the United States Patent and Trademark Office*